(12) United States Patent
Sugimoto et al.

(10) Patent No.: US 6,924,987 B2
(45) Date of Patent: Aug. 2, 2005

(54) WIRING BOARD AND PROCESS FOR PRODUCING THE SAME

(75) Inventors: Hiroshi Sugimoto, Tokyo (JP); Tatsuya Ohtaka, Tokyo (JP); Shigeharu Takahagi, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 432 days.

(21) Appl. No.: 10/232,661

(22) Filed: Sep. 3, 2002

(65) Prior Publication Data

US 2003/0043556 A1 Mar. 6, 2003

(30) Foreign Application Priority Data

Sep. 5, 2001 (JP) ........................................ 2001-268720

(51) Int. Cl.[7] .............................. H05K 1/11; H05K 1/14
(52) U.S. Cl. ...................................... 361/794; 361/795
(58) Field of Search ................................ 361/792–795; 174/255–259, 263–264; 428/209; 29/846–847; 257/698–700

(56) References Cited

U.S. PATENT DOCUMENTS

| | | | | |
|---|---|---|---|---|
| 5,476,719 A | * | 12/1995 | Sandell et al. | 428/457 |
| 5,488,542 A | * | 1/1996 | Ito | 36/793 |
| 6,262,597 B1 | * | 7/2001 | Chazan et al. | 324/537 |
| 6,437,991 B1 | * | 8/2002 | Rog et al. | 361/794 |

FOREIGN PATENT DOCUMENTS

JP 6-283866 10/1994

* cited by examiner

*Primary Examiner*—Kamand Cuneo
*Assistant Examiner*—Tuan Dinh
(74) *Attorney, Agent, or Firm*—Foley & Lardner LLP

(57) ABSTRACT

A wiring board with microstrip structure has: a first conductor layer that is provided with conductor wirings to be connected to a semiconductor chip in its external terminal (bonding pad); a second conductor layer that is provided with a conductor pattern connected through a via to a ground wiring, for supplying a power supply of ground potential to the semiconductor chip; and a third conductor layer that is provided with a power supply terminal connected through a via to a power supply wiring for supplying an operation power supply of a potential other than the ground potential to the semiconductor chip, a signal terminal connected through a via to a signal wiring for transmitting an electric signal, and a ground terminal connected through a via to the conductor pattern in the second conductor layer.

8 Claims, 22 Drawing Sheets

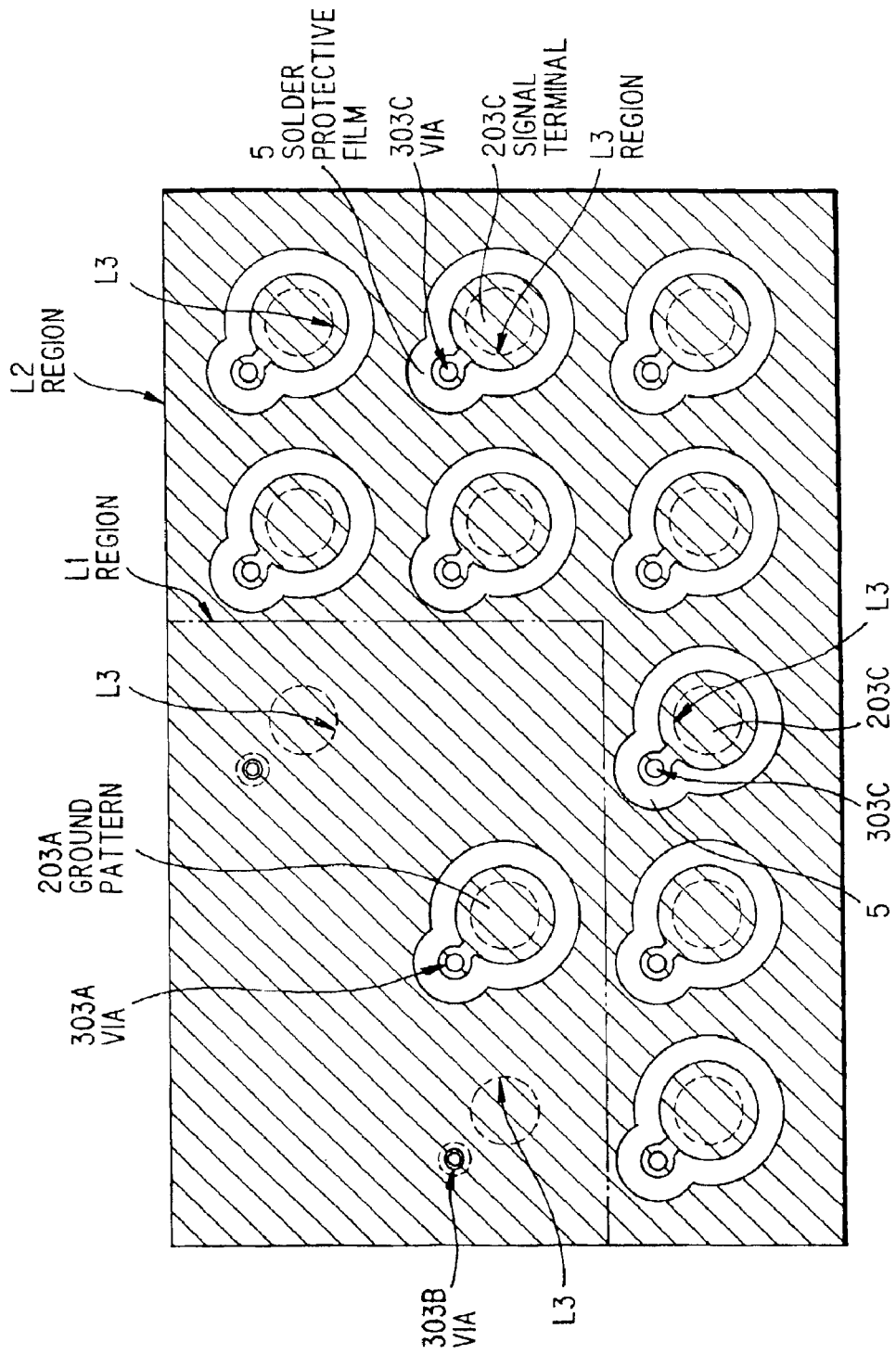

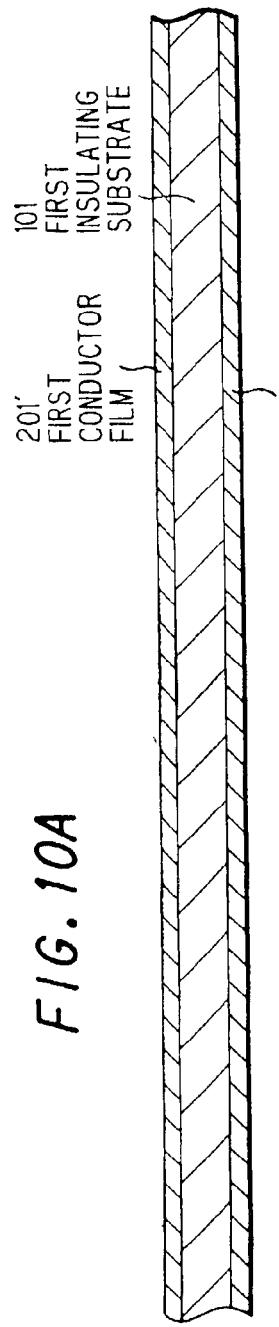 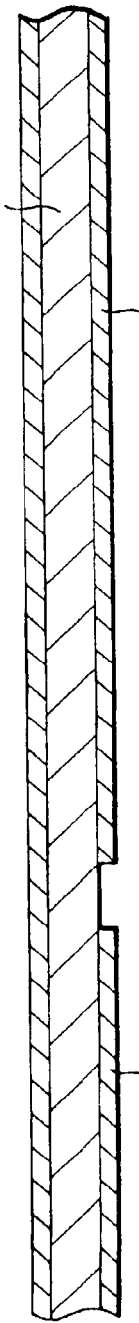 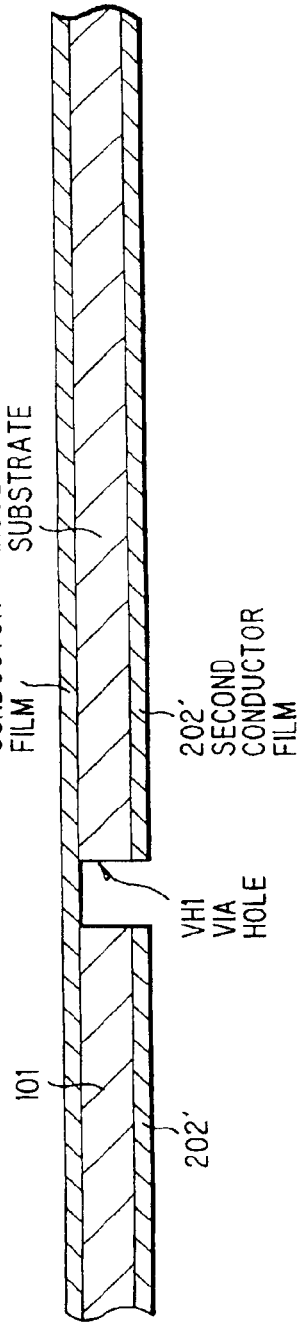
FIG. 10A
FIG. 10B
FIG. 10C

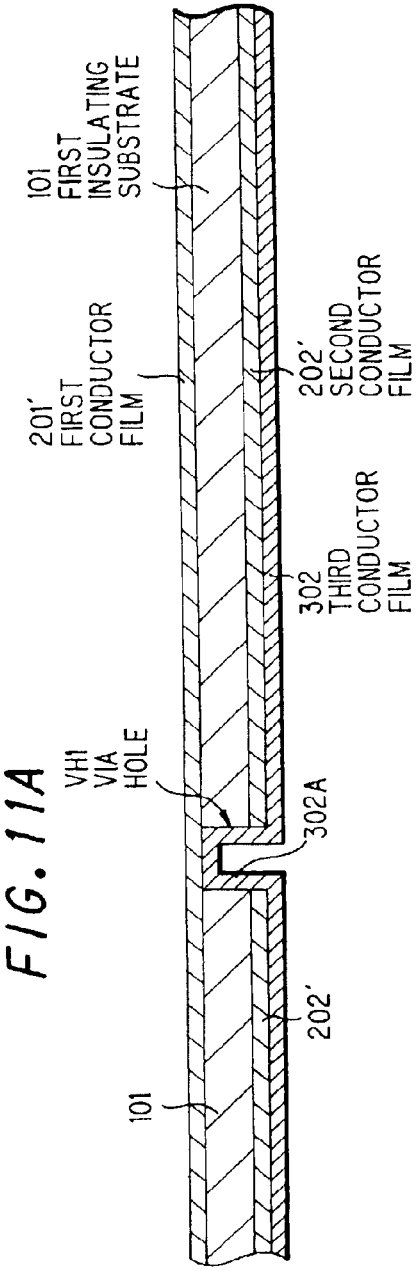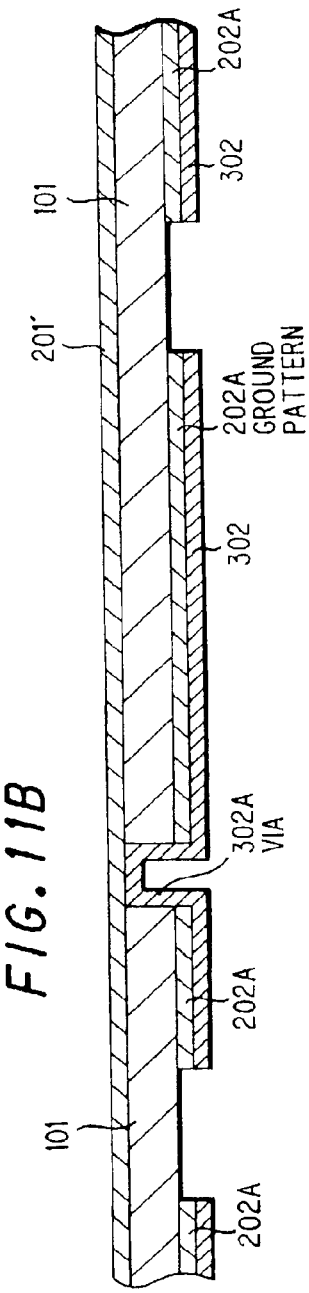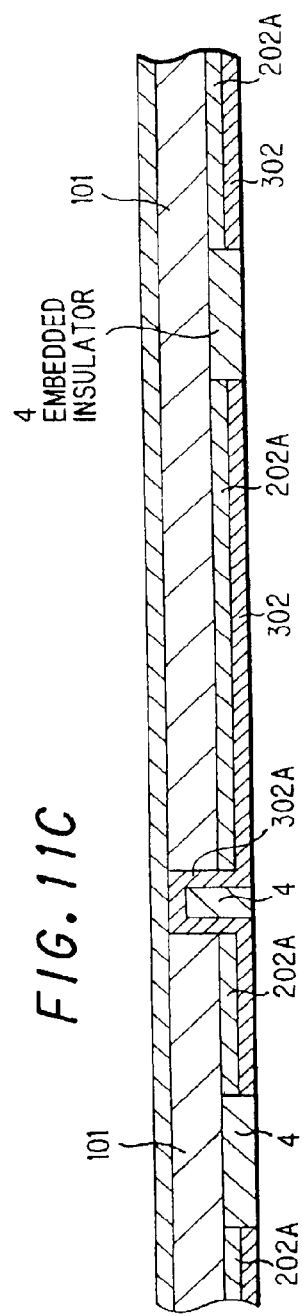

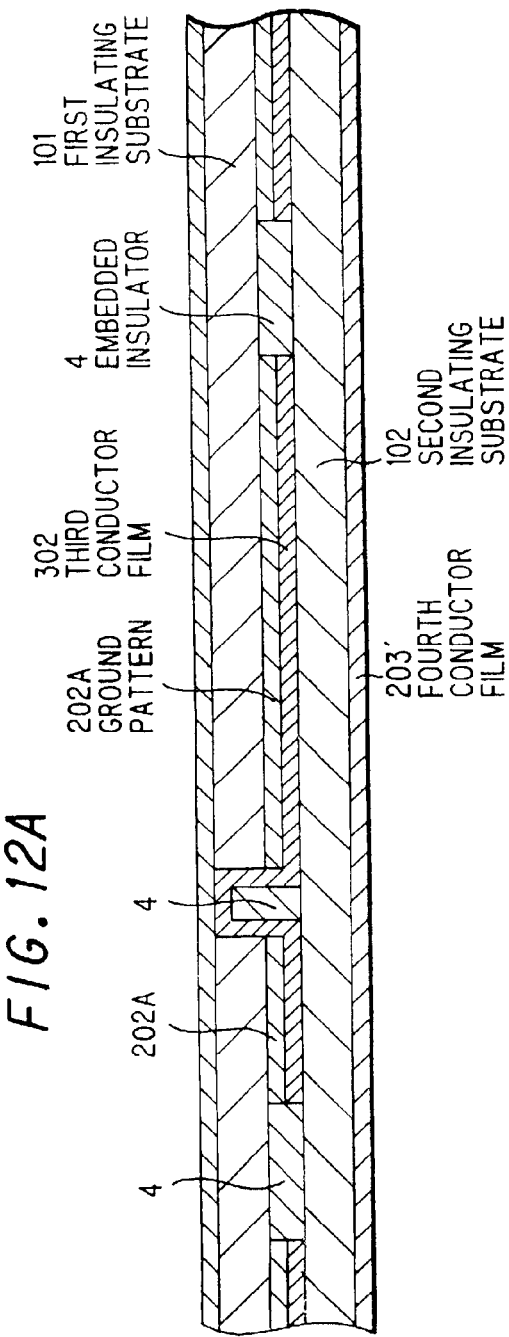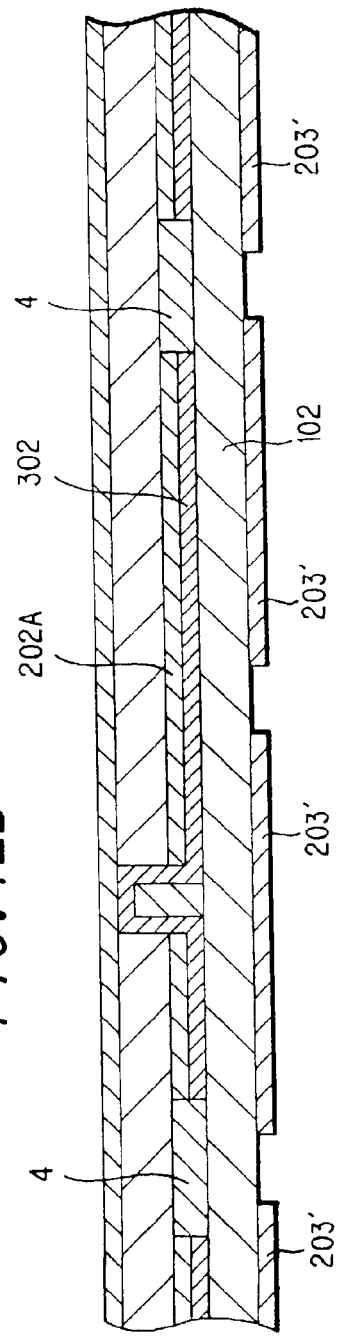

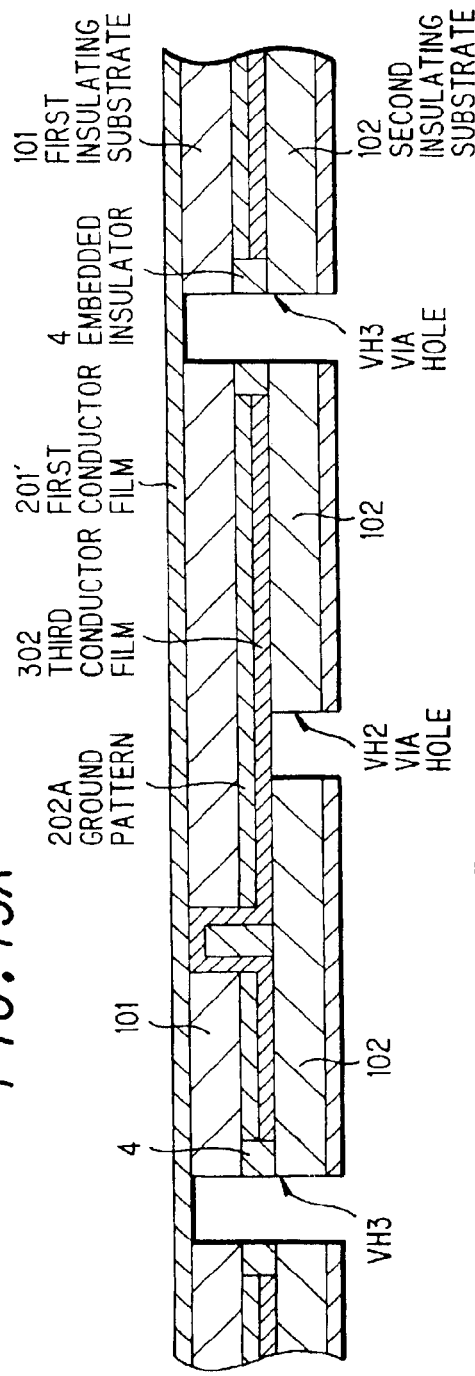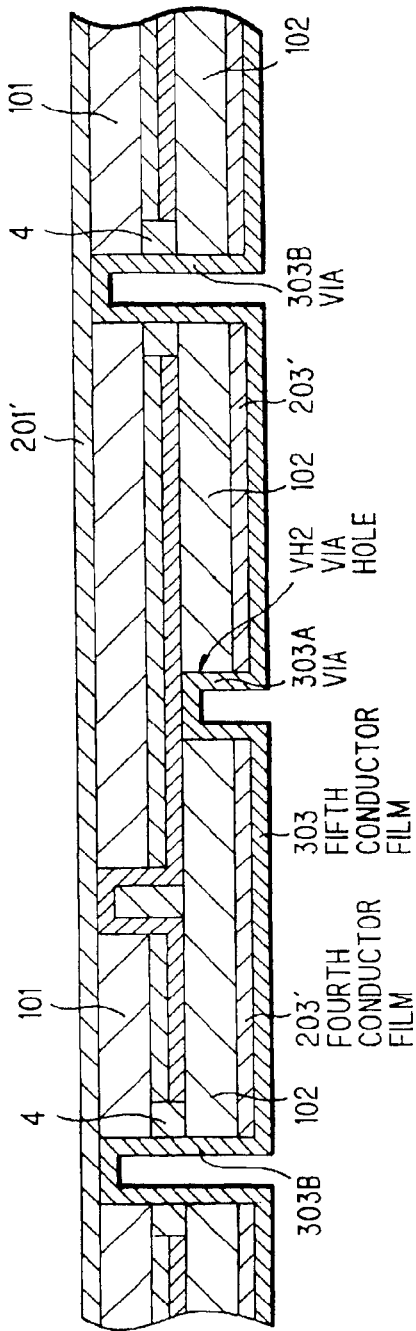

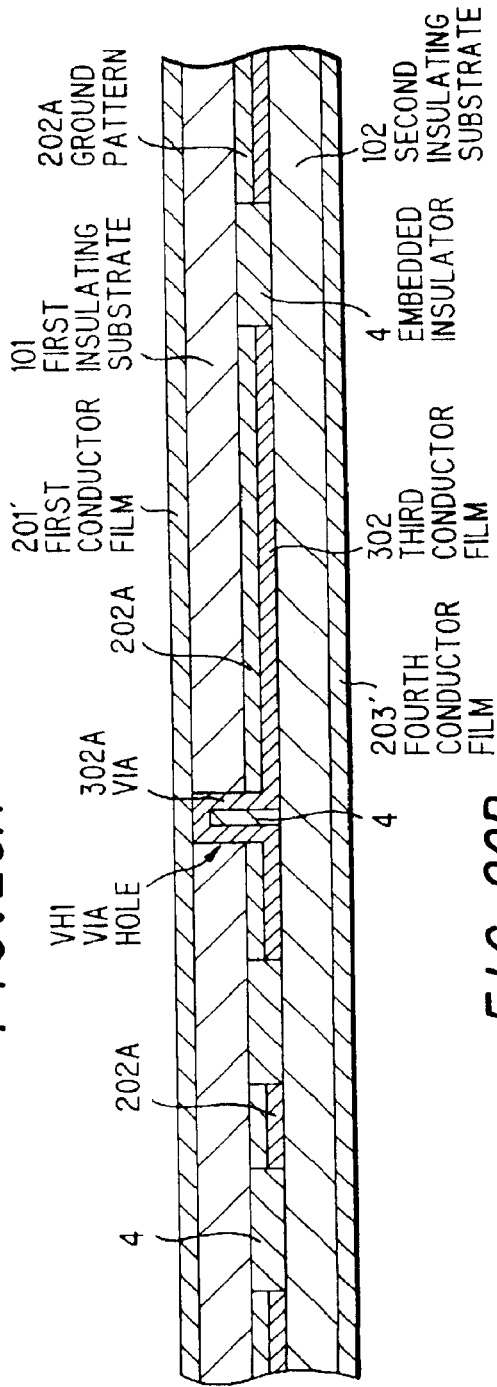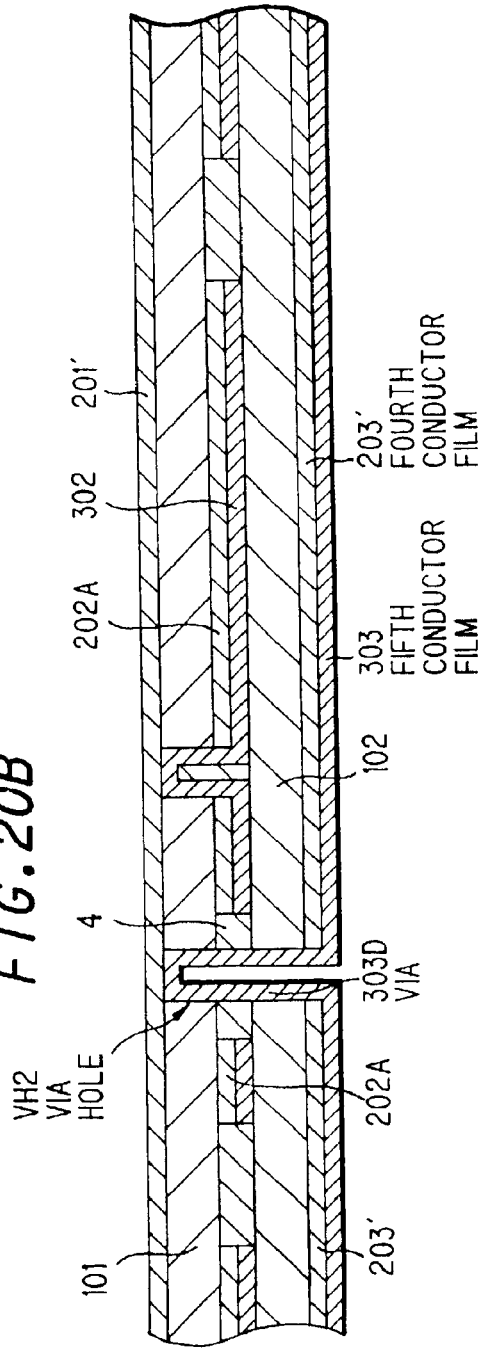

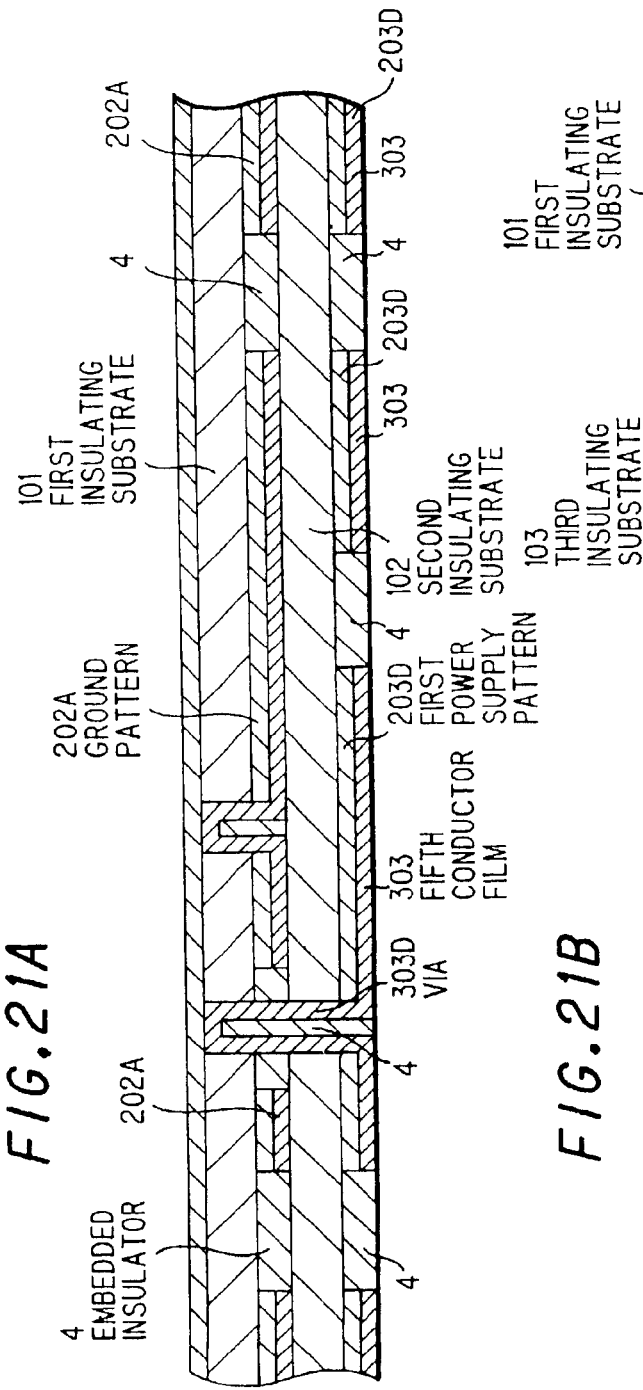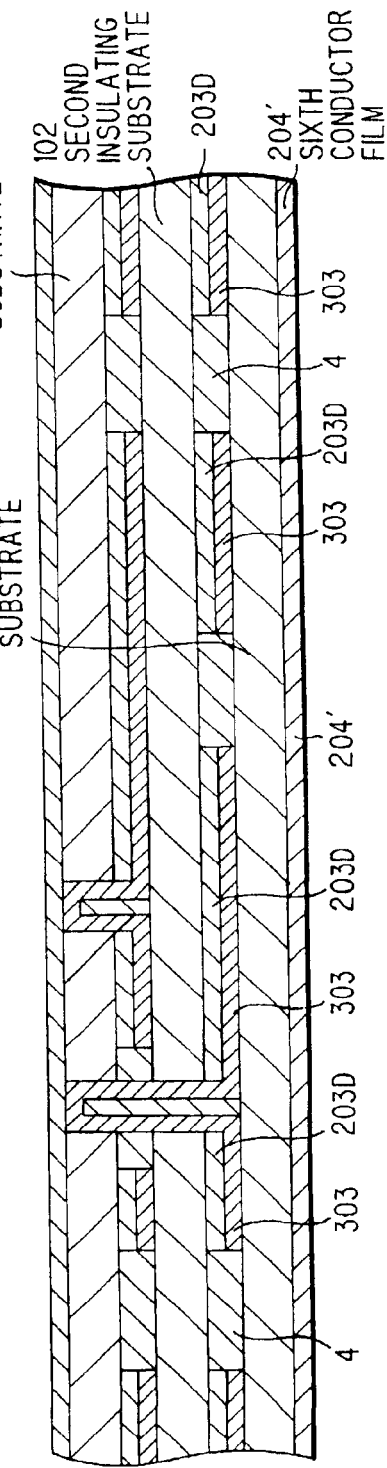

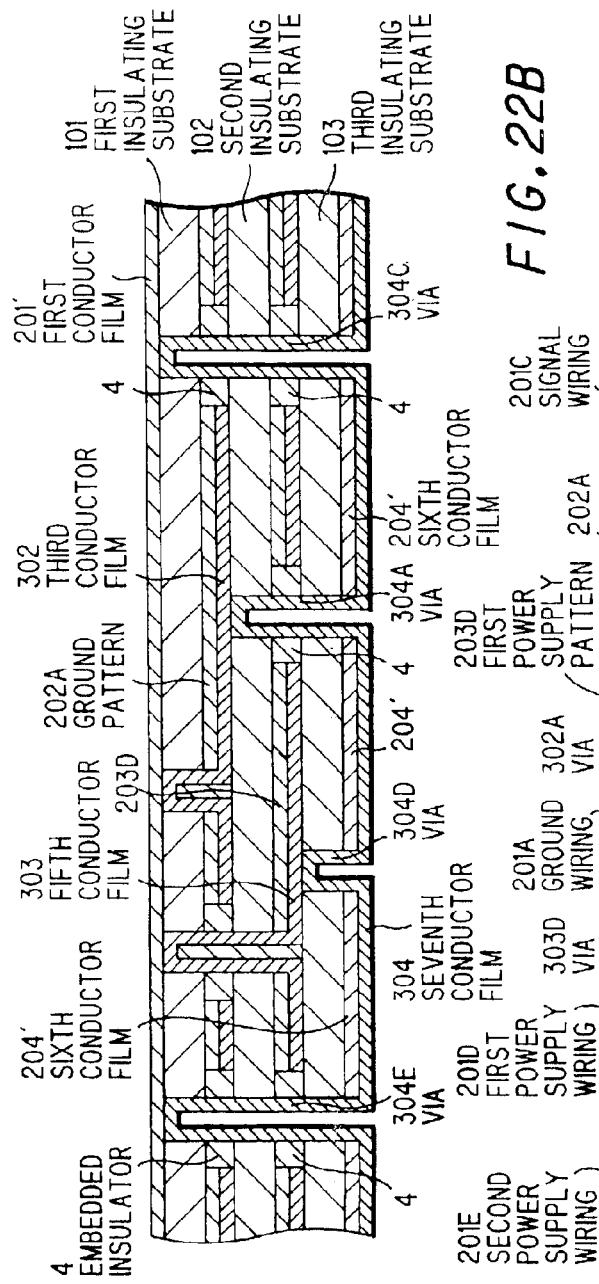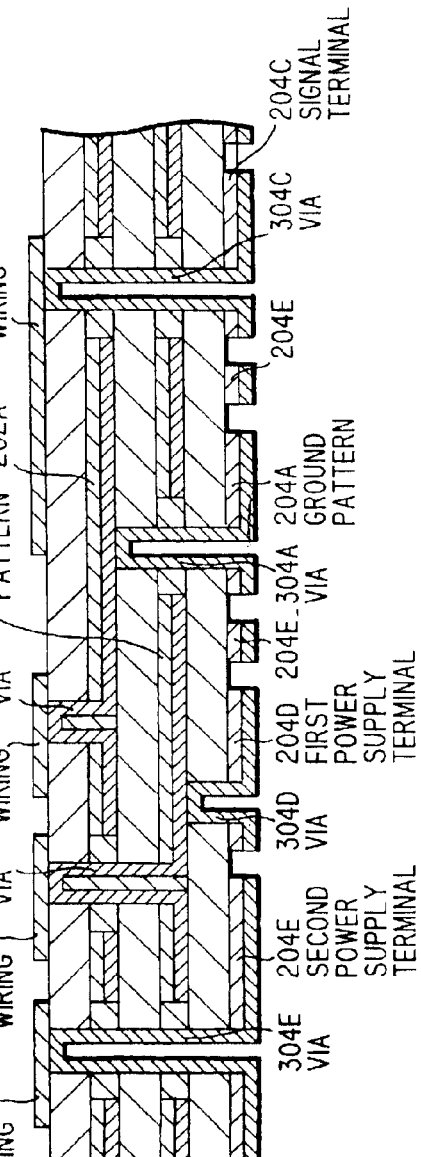

WIRING BOARD AND PROCESS FOR PRODUCING THE SAME

BACKGROUND OF THE INVENTION

1. Field of the Invention

The invention relates to a wiring board and a process for producing the same, and more particularly to a technique which can be effectively applied to a wiring board having a microstrip structure comprising: a signal wiring layer provided on one main surface of an insulating layer; and a ground layer or a power supply layer provided on another main surface opposite to the main surface on which the signal wiring layer in the insulating layer has been provided.

2. Prior Art

In a conventional BGA (ball grid array) semiconductor device, as shown in FIGS. 1A and 1B, a semiconductor chip 7 is mounted on a wiring board (an interposer) comprising a conductor wiring 201 having a predetermined pattern provided on the surface of an insulating substrate 1.

In the case of a semiconductor device as shown in FIGS. 1A and 1B, in the wiring board, the conductor wiring 201 is provided on the insulating substrate 1 formed of, for example, a thin polyimide tape having a thickness of about 20 to 50 μm. Due to this structure, the strength is low, and deformation is likely to occur in a region on the outer side of a region in which the semiconductor chip 7 has been mounted. To solve this problem, for example, as shown in FIG. 1B, the structure is reinforced, for example, with a metallic cover plate 10.

Further, the wiring board for use in the BGA semiconductor device is used, for example, for matching between an external terminal (a bonding pad) of the semiconductor chip 7 and a terminal (wiring) on a mounting substrate for mounting thereon the semiconductor device, or for grid conversion. As shown in FIG. 2, a first conductor layer M1 is provided on an insulating layer B1, constituted by the insulating substrate 1, in its surface on which the semiconductor chip 7 is mounted, and a second conductor layer M2 is provided on the insulating substrate 1 in its surface opposite to the surface on which the first conductor layer M1 has been provided. In this case, as shown in FIGS. 2 and 3, on the first conductor layer M1 are provided a conductor wiring 201A for providing a power supply of ground potential to the semiconductor chip 7 (hereinafter referred to as "ground wiring"), a conductor wiring 201B for providing an operation power supply of a potential other than the ground potential to the semiconductor chip 7 (hereinafter referred to as "power supply wiring"), and a conductor wiring 201C for transmitting an electric signal (hereinafter referred to as "signal wiring"). Further, in this case, the ground potential is a ground reference potential, and a power supply of 0 (zero) volt (V) or a predetermined potential is provided.

Further, a solder protective film (a solder resist) 5 is provided on the surface of the first conductor layer M1 so that a portion, to be connected to an external electrode in the semiconductor chip 7, in each of the ground wiring 201A, the power supply wiring 201B, and the signal wiring 201C is opened. A terminal plating 6, such as a gold plating, is provided in the opening in the solder protective film 5.

As shown in FIGS. 2 and 4, a connection terminal 202A to be connected to the ground wiring 201A (hereinafter referred to as "ground terminal"), a connection terminal 202B to be connected to the power supply wiring 201B (hereinafter referred to as "power supply terminal"), and a connection terminal 202C to be connected to the signal wiring 201C (hereinafter referred to as "signal terminal") are provided, as external connection terminals to be connected to the terminals on the mounting substrate, in the second conductor layer M2 on the insulating substrate 1 in its surface opposite to the surface on which the semiconductor chip 7 is to be mounted. An electrolytic copper plating 3 is provided on the surface of each of the ground terminal 202A, the power supply terminal 202B, and the signal terminal 202C. Further, the electrolytic copper plating 3 is also provided on the inner wall of openings (via holes) VH provided at the predetermined position of the insulating substrate 1. Each conductor wiring in the first conductor layer M1 is electrically connected to a predetermined external connection terminal in the second conductor layer M2 through the electrolytic copper plating (via) within the via hole VH. Specifically, the ground wiring 201A is connected to the ground terminal 202A through a via 3A, the power supply wiring 201B is connected to the power supply terminal 202B through a via 3B, and the signal wiring 201C is connected to the signal terminal 202C through a via 3C.

Further, in this case, the ground terminal 202A and the power supply terminal 202B are provided in a small wiring length so as to minimize the influence of voltage drop or the like attributable to a long path to a corresponding external terminal in the semiconductor chip 7. For example, they are provided on the inside of the signal terminal 202C and within a region in which the semiconductor chip 7 is mounted.

Further, a solder protective film (a solder resist) 5 is provided on the surface of the second conductor layer M2 so that a region L3, to which a ball terminal 11 is to be connected, on the ground terminal 202A, the power supply terminal 202B, and the signal terminal 202C is opened. As shown in FIG. 2C, a terminal plating 6, such as a gold plating, is provided in the region L3 to which the ball terminal 11 is to be connected.

For the BGA semiconductor device as shown in FIGS. 1A and 1B, due to a recent tendency toward higher speed (higher frequency) of the operation, the impedance control of each conductor wiring provided on the wiring board used in the semiconductor device, particularly the signal wiring 201C, has become more and more important. To meet this demand, as shown in FIGS. 2 and 4, the ground terminal 202A is provided so as to extend to the whole area of the region except for the circumference of the power supply terminal 202B and the signal terminal 202C to constitute a microstrip structure.

When the density of the signal wiring 201C is increased and the conductor pitch or conductor spacing is reduced, in the transmission of a high frequency signal, resonance between adjacent signal wirings or mutual inductance cause noise in a signal being transmitted through the signal wiring 201C. As a result, the signal waveform is lost. The adoption of the microstrip structure formed by extending the ground terminal 202A to the whole area of the insulating substrate 1 can prevent a deterioration in high frequency characteristics of electric signals, because an eddy current flows, in the ground terminal 202A, in such a direction that bucks a magnetic flux caused by current which flows through each signal wiring to apparently reduce self-inductance of the signal wiring, mutual inductance between signal wirings, or inductive crosstalk.

In the prior art techniques, however, in the microstrip structure formed by extending the ground terminal 202A to the whole area of the insulating substrate 1, the power supply terminal 202B and the signal terminal 202C are also provided in the second conductor layer M2, that is, on the insulating substrate 1 in its surface provided with the ground terminal 202A. Therefore, as shown in FIG. 4, the ground terminal 202A is provided in a pattern such that the circumference of the power supply terminal 202B, the via 3B the via 3B for connecting the power supply wiring 201B to the power supply terminal 202B, the signal terminal 202C, and the via 3C for connecting the signal wiring 201C to the signal terminal 202C is opened.

When a reduction in size of the wiring board or an increase in density of conductor wirings provided on the wiring boards is contemplated, or when the number of the external connection terminals is increased, for example, as a result of higher function of the semiconductor chip, as shown in FIG. 3, in order to allow the power supply terminals 202B and the signal terminals 202C come close to each other as much as possible, a section L4, in which the signal wiring 201C passes over the power supply terminal 202B or the signal terminal 202C, is disadvantageously formed.

When the section L4, in which the signal wiring 201C partially passes over the power supply terminal 202B or the signal wiring 202C, exists, unlike the section in which the wiring passes over the ground terminal 202A, the microstrip effect is unsatisfactory in the section L4. For this reason, in controlling the characteristic impedance of the signal wiring 201C, the distribution of the section L4 should be taken into consideration, disadvantageously making it difficult to control the impedance.

Further, when the section L4, in which the signal wiring 201C passes over the power supply terminal 202B or the signal terminal 202C, exists, in the section L4, noise is likely to occur in the electric signal being transmitted through the signal wiring 201C, and, thus, the characteristics of high frequency signals being transmitted through the signal wiring 201C are disadvantageously likely to be deteriorated.

SUMMARY OF THE INVENTION

Accordingly, it is an object of the invention to provide a technique which, in a wiring board having a microstrip structure, can facilitate the control of the characteristic impedance.

It is another object of the invention to provide a technique which, in a wiring board having a microstrip structure, can prevent a deterioration in high frequency characteristics of electric signals.

It is a further object of the invention to provide a technique which, in a wiring board having a microstrip structure, can easily realize high-density wiring.

The above and other objects and novel features of the invention will be apparent from the following description and the accompanying drawings.

The features of the invention disclosed herein will be summarized.

(1) A wiring board comprising: a first insulating layer; a first conductor layer provided on the surface of the first insulating layer; a second conductor layer provided on the first insulating layer in its surface remote from the first conductor layer; and a third conductor layer provided through a second insulating layer on the second conductor layer provided on the first insulating layer, wherein conductor wirings to be connected to a semiconductor chip in its external terminal (bonding pad) are provided in the first conductor layer, only a conductor pattern connected through a via to a ground wiring, for supplying a power supply of ground potential to the semiconductor chip, among the conductor wirings provided in the first conductor layer is provided in the second conductor layer, a power supply terminal connected through a via to a power supply wiring, for supplying an operation power supply of a potential other than the ground potential to the semiconductor chip, among the conductor wirings provided in the first conductor layer, a signal terminal connected through a via to a signal wiring for transmitting an electric signal, and a ground terminal connected through a via to the conductor pattern in the second conductor layer are provided in the third conductor layer, and the conductor pattern provided in the second conductor layer is spread over the whole region except for the circumference of the via for connecting the power supply wiring to the power supply terminal and the via for connecting the signal wiring to the signal terminal.

In the wiring board according to the item (1), the provision of the conductor pattern, connected to the ground wiring, in the second conductor layer and the provision of the ground terminal, the power supply terminal, and the signal terminal in the third conductor layer can increase the area of the conductor pattern provided in the second conductor layer. Therefore, the passage of the conductor wiring provided in the first conductor layer, particularly the signal wiring, over the region not provided with the conductor pattern can be avoided. Therefore, the characteristic impedance can be easily controlled by a microstrip comprising the signal wiring, the first insulating layer, and the conductor pattern.

Further, the signal wiring can be always passed over the conductor pattern. Therefore, noise attributable to mutual impedance between the conductor wirings can be reduced, and a deterioration in high frequency characteristics of signal transmitted can be prevented.

In the signal wiring, an increase in signal speed, that is, an increase in frequency of signals causes a function as an inductor. Accordingly, in the wiring board according to the item (1), spreading of the power supply terminal over the whole region except for the circumference of the ground terminal and the signal terminal can reduce the function of the signal wiring as the inductor.

Further, in the wiring board according to the item (1), possible methods for connecting the conductor wiring in the first conductor layer to the terminal of the third conductor layer through a via include a method wherein they are directly connected to each other through a via provided along the inner wall of the via hole extended through the first insulating layer and the second insulating layer and a stack via method wherein they are connected to each other through two-stage via, i.e., a via extended through the first insulating layer and a via extended through the second insulating layer. Direct connection through a via extended through the first insulating layer and the second insulating layer can reduce the area of the opening (clearance hole), provided around the via, in the conductor pattern provided in the second conductor layer. Therefore, the possibility of the passage of the conductor wiring through the outside of the conductor pattern in the second conductor layer can be further reduced, and the characteristic impedance can be easily controlled.

Further, since the conductor wiring in the first conductor layer is connected to the second terminal through a via extended through the first insulating layer and the second insulating layer, for example, as compared with connection by stack via, the area of the opening in the conductor pattern in the second conductor layer (ground layer) can be reduced by the land width of the via. Therefore, the spacing between the vias can be easily narrowed, and, thus, higher density wiring boards can be easily realized.

(2) A wiring board comprising: a first insulating layer; a first conductor layer provided on the surface of the first insulating layer; a second conductor layer provided on the first insulating layer in its surface remote from the first conductor layer; a third conductor layer provided through a second insulating layer on the surface of the second conductor layer provided on the first insulating layer; and a fourth conductor layer provided through a third insulating layer on the surface of the third conductor layer, wherein conductor wirings to be connected to a semiconductor chip in its external terminal (bonding pad) are provided in the first conductor layer, only a conductor pattern connected through a via to a ground wiring, for supplying a power supply of ground potential to the semiconductor chip, among the conductor wirings provided in the first conductor layer is provided in the second conductor layer, a conductor pattern connected through a via to a first power supply wiring, for supplying an operation power supply of a first potential different from the ground potential to the semiconductor chip, among the conductor wirings provided in the first conductor layer is provided in the third conductor layer, a second power supply terminal connected through a via to a second power supply wiring, for supplying an operation power supply of a second potential different from the ground potential and the first potential to the semiconductor chip, among the conductor wirings provided in the first conductor layer, a signal terminal connected through a via to a signal wiring for transmitting an electric signal, a ground terminal connected through a via to the conductor pattern in the second conductor layer, and a first power supply terminal connected through a via to the conductor pattern in the third conductor layer are provided in the fourth conductor layer, and the conductor pattern provided in the second conductor layer is spread over the whole region except for the circumference of the via for connecting the second power supply wiring to the second power supply terminal, the via for connecting the first power supply terminal to the conductor pattern in the third conductor layer, and the via for connecting the signal wiring to the signal terminal.

In the wiring board according to the item (2), as with the wiring board according to the item (1), the provision of the conductor pattern, connected to the ground wiring, in the second conductor layer and the provision of the ground terminal, the power supply terminal, and the signal terminal in the fourth conductor layer can increase the area of the conductor pattern provided in the second conductor layer. Therefore, the passage of the conductor wiring provided in the first conductor layer, particularly the signal wiring, over the region not provided with the conductor pattern can be avoided. Therefore, the characteristic impedance can be easily controlled by a microstrip comprising the signal wiring, the first insulating layer, and the conductor pattern.

Further, the signal wiring can be always passed over the conductor pattern. Therefore, noise attributable to mutual impedance between the conductor wirings can be reduced, and a deterioration in high frequency characteristics of signal transmitted can be prevented.

In the signal wiring, an increase in signal speed, that is, an increase in frequency of signals causes a function as an inductor. Accordingly, in the wiring board according to the item (2), spreading of the power supply terminal over the whole region except for the circumference of the ground terminal and the signal terminal can reduce the function of the signal wiring as the inductor.

Further, in the wiring board in recent years, for example, higher functions of semiconductor chip mounted and the adoption of LSI in systems have led to the adoption of two or more operation power supplies of potentials other than the ground potential. In this case, in the wiring board according to the item (2), the conductor layer to be provided with the conductor pattern of the first operation power supply is provided separately from the conductor layer to be provided with the conductor pattern of the second operation power supply, and, in addition, the area of the conductor pattern of the first operation power supply and the area of the conductor pattern of the second operation power supply are maximized. This can reduce the function as the inductor caused by an increase in signal speed.

Further, in the wiring board according to the item (2), possible methods for connecting the conductor wiring in the first conductor layer to the conductor pattern in the third conductor layer through a via include a method wherein they are directly connected to each other through a via provided along the inner wall of the via hole extended through the first insulating layer and the second insulating layer and a stack via method wherein they are connected to each other through two-stage via, i.e., a via extended through the first insulating layer and a via extended through the second insulating layer. Direct connection through a via extended through the first insulating layer and the second insulating layer can reduce the area of the opening (clearance hole), provided around the via, in the conductor pattern provided in the second conductor layer. Therefore, the possibility of the passage of the conductor wiring through the outside of the conductor pattern in the second conductor layer can be further reduced, and the characteristic impedance can be easily controlled.

Further, since the conductor wiring in the first conductor layer is connected to the second terminal through a via extended through the first insulating layer and the second insulating layer, for example, as compared with connection by stack via, the area of the opening in the conductor pattern in the second conductor layer (ground layer) can be reduced by the land width of the via. Therefore, the spacing between the vias can be easily narrowed, and, thus, higher density wiring boards can be easily realized. The direct connection of the second terminal through a via extended through the first insulating layer, the second insulating layer, and the third insulating layer can reduce the area of the opening (clearance hole) of the conductor pattern in the ground layer, and, thus, higher density wiring boards can be easily realized.

Likewise, when the conductor wiring in the first conductor layer is connected to the terminal in the fourth conductor layer through a via, direct connection through a via extended through the first insulating layer, the second insulating layer, and the third insulating layer can reduce the area of the opening of the conductor pattern in the second conductor layer as compared with stack via connection, can easily provide microstrip effect, and facilitates the control of the characteristic impedance.

(3) A process for producing a wiring board, comprising the steps of: forming a first conductor film on a first main surface of a first insulating substrate and forming a second conductor film on a second main surface of the first insulating substrate remote from the first conductor film; forming a first via hole at a predetermined position of the first insulating substrate from the second conductor film side; forming a third conductor film on the surface of the second conductor film and within the first via hole; etching the second conductor film and the third conductor film to form a conductor pattern having openings at predetermined positions; forming a fourth conductor film on the surface of the conductor pattern through a second insulating substrate; forming, from the fourth conductor film side, a second via hole, which extends through the second insulating substrate to the conductor pattern, and a third via hole which extends through the second insulating substrate and the first insulating substrate to the first conductor film; forming a fifth conductor film on the surface of the fourth conductor film and within the second via hole and the third via hole; etching the first conductor film to form a conductor wiring to be connected to an external terminal (a bonding pad) of a semiconductor chip; and etching the fourth conductor film and the fifth conductor film to form a connection terminal to be connected to the conductor wiring or the conductor pattern through the via.

In the production process according to the item (3), the third via hole, which extends from the fourth conductor film side through the second insulating substrate and the first insulating substrate to the first conductor film, is formed, and the fifth conductor film (via) is formed on the inner wall of the third via hole. According to this construction, the conductor wiring formed by etching the first conductor film and the connection terminal formed by etching the fourth conductor film can be connected to each other by the fifth conductor film only. Therefore, unlike the conventional stack via, continuity failure caused by misregistration of vias in the case of stacking of vias in two or more stages can be reduced.

Further, the second via hole and the third via hole are preferably simultaneously formed, for example, by using a laser beam, such as a carbonic gas laser beam, which can selectively etch the insulator. In the laser etching, the time and the like are controlled based on the third via hole depth. Since the carbonic gas laser selectively etches only the insulator, the etching for the formation of the second via hole is ended when the hole has reached the conductor pattern. Thus, via holes different from each other in depth can be simultaneously formed.

(4) A process for producing a wiring board, comprising the steps of: forming a first conductor film on a first main surface of a first insulating substrate and forming a second conductor film on a second main surface of the first insulating substrate remote from the first conductor film; forming a first via hole at a predetermined position of the first insulating substrate from the second conductor film side; forming a third conductor film on the surface of the second conductor film and within the first via hole; etching the second conductor film and the third conductor film to form a conductor pattern having openings at its predetermined positions; forming a fourth conductor film through a second insulating substrate on the surface of the conductor pattern formed by etching the second conductor film and the third conductor film; forming, from the fourth conductor film side, a second via hole which extends through the second insulating layer and the first insulating layer to the first conductor film; forming a fifth conductor film on the surface of the fourth conductor film and within the second via hole; etching the fourth conductor film and the fifth conductor film to form a conductor pattern having openings at its predetermined positions; forming a sixth conductor film through a third insulating substrate on the conductor pattern layer formed by etching the fourth conductor film and the fifth conductor film; forming, from the sixth conductor film side, a third via hole, which extends through the third insulating layer and the second insulating layer to the conductor pattern formed by etching the second conductor film and the third conductor film, a fourth via hole, which extends through the third insulating layer to the conductor pattern formed by etching the fourth conductor film and the fifth conductor film, and a fifth via hole which extends through the third insulating layer, the second insulating layer, and the first insulating layer to the first conductor film; forming a seventh conductor film on the surface of the sixth conductor film and within the third via hole, the fourth via hole, and the fifth via hole; etching the first conductor film to form a conductor wiring to be connected to an external terminal (a bonding pad) of a semiconductor chip; and etching the sixth conductor film and the seventh conductor film to form a connection terminal to be connected through the via to any one of the conductor pattern formed by etching the conductor wiring, the second conductor film, and the third conductor film and the conductor pattern formed by etching the fourth conductor film and the fifth conductor film.

In the production process according to the item (4), the third via hole, which extends from the sixth conductor film side through the third insulating layer, the second insulating layer, and the first insulating layer to the first conductor film, the fourth via hole, which extends through the third insulating layer and the second insulating layer to the conductor pattern formed by etching the second conductor film and the third conductor film, and the fifth via hole, which extends through the third insulating layer to the conductor pattern formed by etching the fourth conductor film and the fifth conductor film, are formed. According to this construction, the connection of the conductor wiring formed by etching the first conductor film and the connection terminal formed by etching the sixth conductor film to the conductor pattern formed by etching the conductor wiring, the second conductor film, and the third conductor film and the conductor pattern formed by etching the fourth conductor film and the fifth conductor film can be achieved by the seventh conductor film only. Therefore, unlike the conventional stack via, continuity failure caused by misregistration of vias in the case of stacking of vias in two or more stages can be reduced.

Further, the third via hole, the fourth via hole, and the fifth via hole are preferably simultaneously formed, for example, by using a laser beam, such as a carbonic gas laser beam, which can selectively etch the insulator. In this laser etching, the time and the like are controlled based on the depth of the fifth via hole having the largest depth. Since the carbonic gas laser selectively etches only the insulator, the etching for the formation of the third via hole and the fourth via hole is ended when the hole has reached the predetermined conductor pattern. Thus, via holes different from each other in depth can be simultaneously formed.

BRIEF DESCRIPTION OF THE DRAWINGS

The invention will be explained in more detail in conjunction with the appended drawings, wherein:

FIG. 1 is a typical schematic view showing the construction of a conventional semiconductor device, wherein

FIG. 9 is a typical schematic plan view showing the construction of the wiring board according to the first preferred embodiment of the invention, illustrating the construction of a third conductor layer in the wiring board shown in FIG. 7;

FIG. 10 is a typical diagram illustrating a production process of the wiring board according to the first preferred embodiment of the invention, wherein FIGS. 10A, 10B, and 10C are cross-sectional views in respective steps as viewed in the same section as that shown in FIG. 5;

FIG. 11 is a typical diagram illustrating a production process of the wiring board according to the first preferred embodiment of the invention, wherein FIGS. 11A, 11B, and 11C are cross-sectional views in respective steps as viewed in the same section as that shown in FIG. 5;

FIG. 12 is a typical diagram illustrating a production process of the wiring board according to the first preferred embodiment of the invention, wherein FIGS. 12A and 12B are cross-sectional views in respective steps as viewed in the same section as that shown in FIG. 5;

FIG. 13 is a typical diagram illustrating a production process of the wiring board according to the first preferred embodiment of the invention, wherein FIGS. 13A and 13B are cross-sectional views in respective steps as viewed in the same section as that shown in FIG. 5;

FIG. 14 is a typical diagram illustrating a production process of the wiring board according to the first preferred embodiment of the invention, wherein FIG. 14 is a cross sectional view in a respective step of the process as viewed in the same section as that shown in FIG. 15;

FIG. 16 is a typical schematic view showing the construction of a semiconductor device using the wiring board according to the first preferred embodiment of the invention, wherein

FIG. 20 is a typical diagram illustrating a production process of the wiring board according to the second preferred embodiment of the invention, wherein FIGS. 20A and 20B are cross-sectional views in respective steps as viewed in the same section as that shown in FIG. 19;

FIG. 21 is a typical diagram illustrating a production process of the wiring board according to the second preferred embodiment of the invention, wherein FIGS. 21A and 21B are cross-sectional views in respective steps as viewed in the same section as that shown in FIG. 19; and FIG. 22 is a typical diagram illustrating a production process of the wiring board according to the second preferred embodiment of the invention, wherein FIGS. 22A and 22B are cross-sectional views in respective steps as viewed in the same section as that shown in FIG. 19.

DESCRIPTION OF THE PREFERRED EMBODIMENTS

Figure 1A:
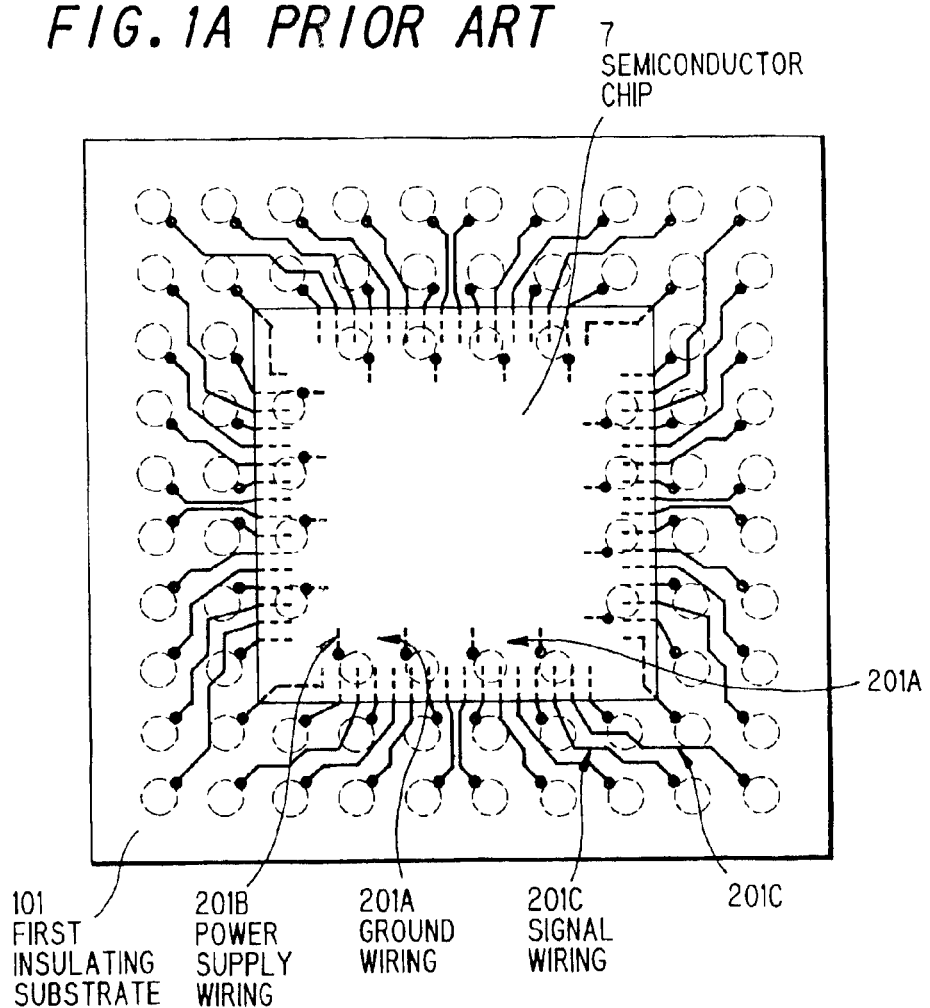
FIG. 1A is a plan view of the whole semiconductor device and FIG. 1B a front view of the semiconductor device shown in FIG. 1A.
Figure 1B:
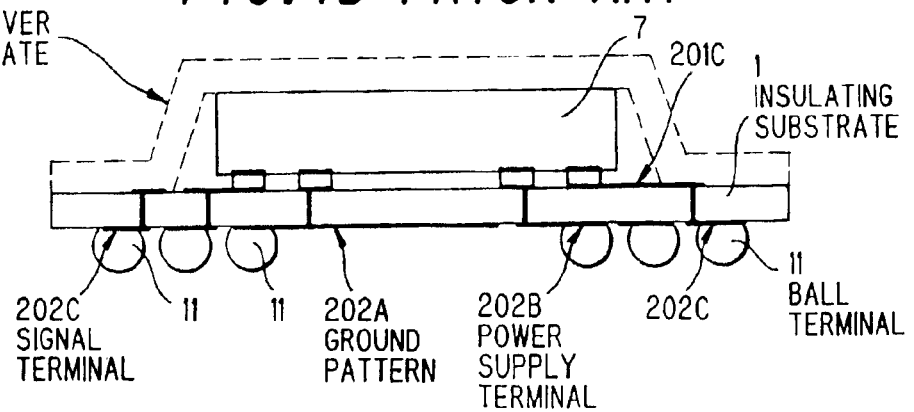
Figure 2:
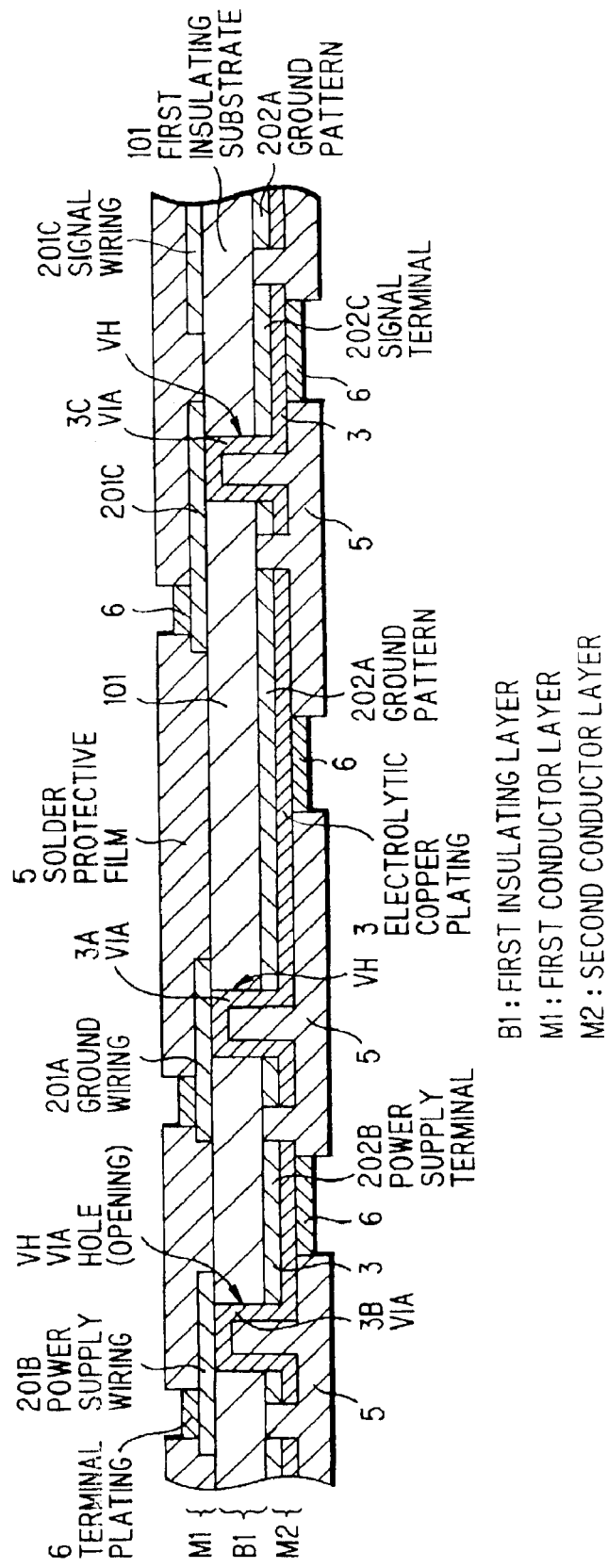
FIG. 2 is a typical schematic cross-sectional view showing the construction of a wiring board for use in a conventional semiconductor device.
Figure 3:
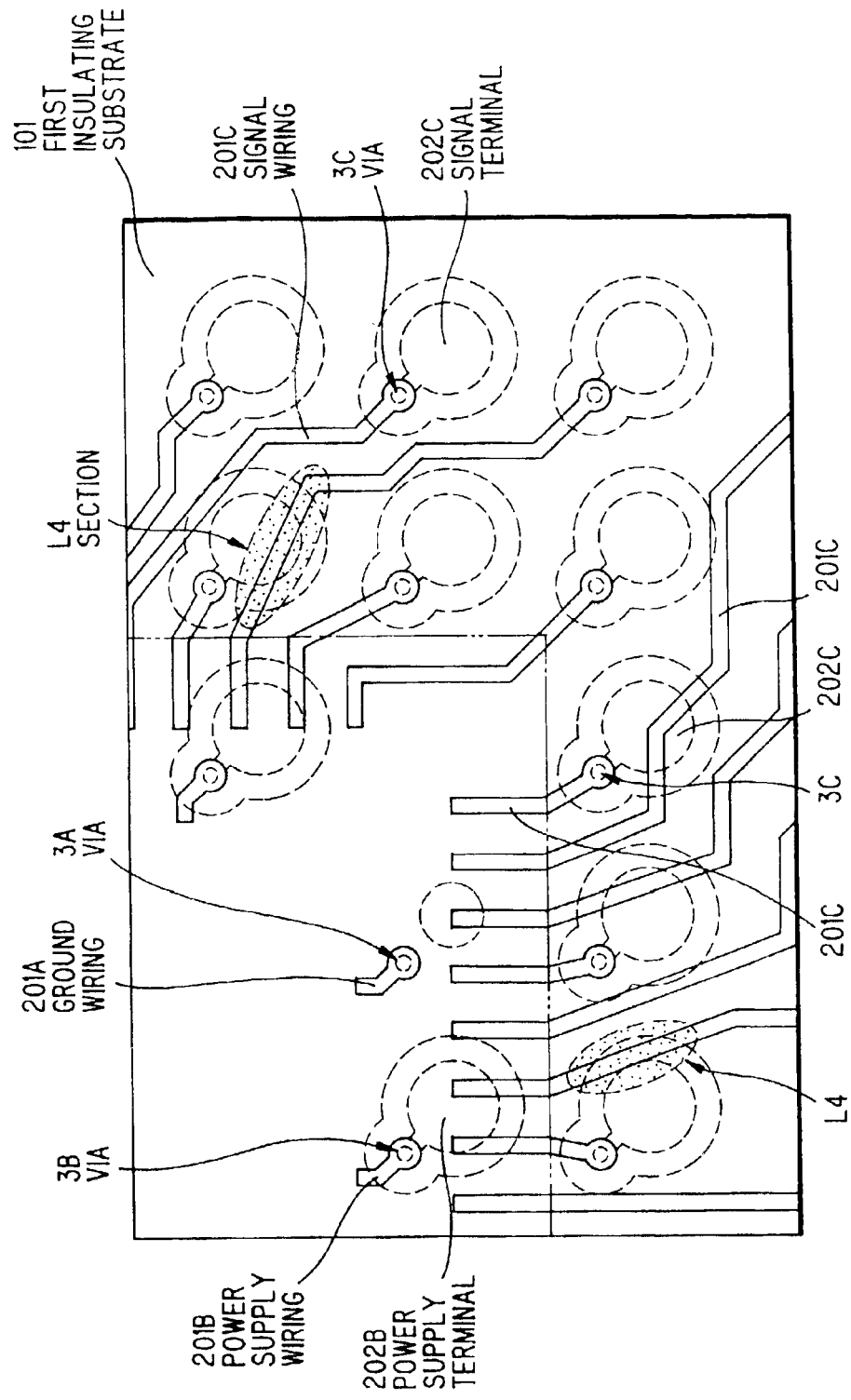
FIG. 3 is a typical schematic plan view showing the construction of a wiring board for use in a conventional semiconductor device.
Figure 4:
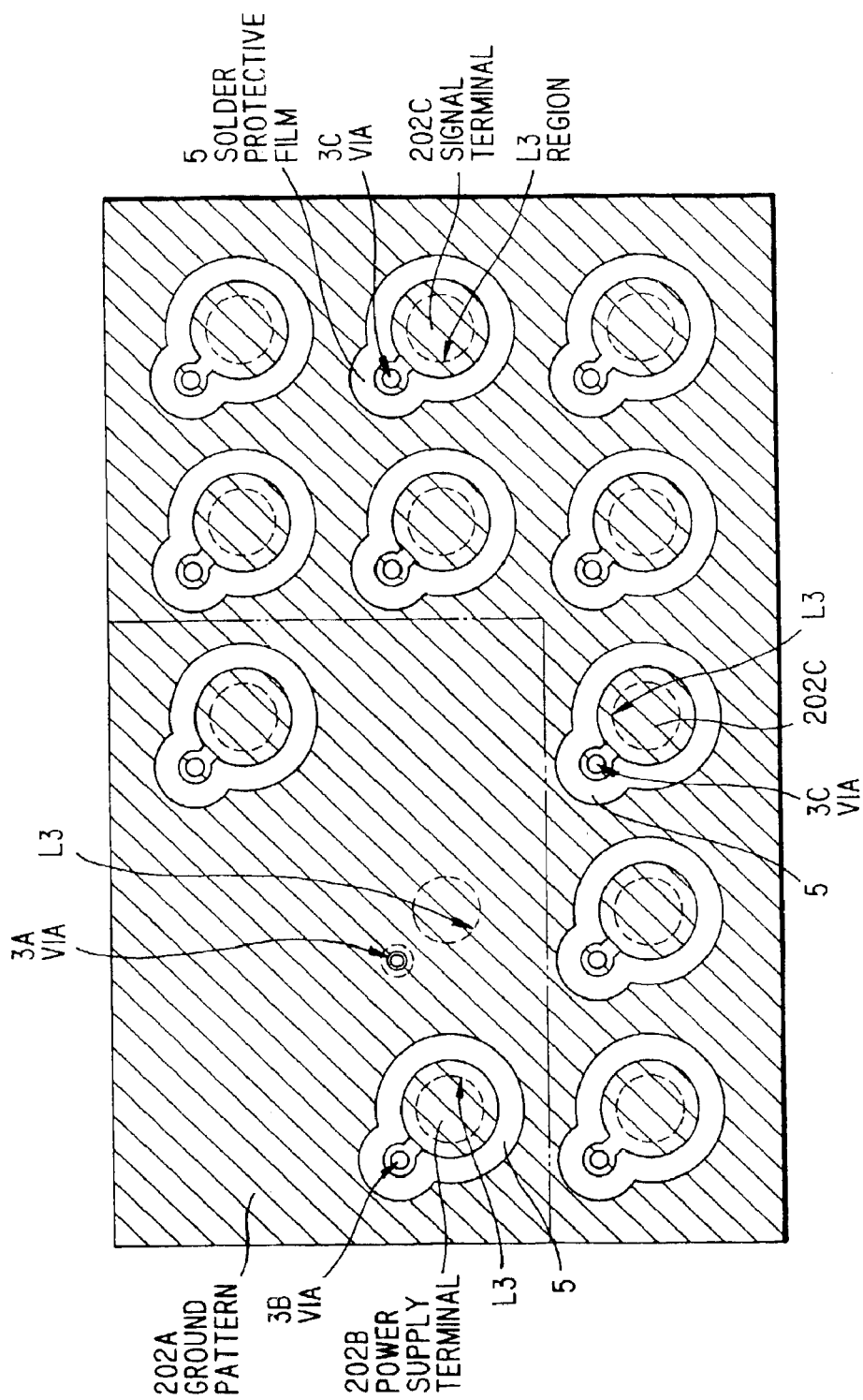
FIG. 4 is a typical schematic plan view showing the construction of a wiring board for use in a conventional semiconductor device.

Preferred embodiments of the invention will be explained in more detail in conjunction with the accompanying drawings.

Throughout all of the views for illustrating the preferred embodiments, like parts are identified with the same reference numerals, and the repeated explanation will be omitted.

First Preferred Embodiment

Figure 5:
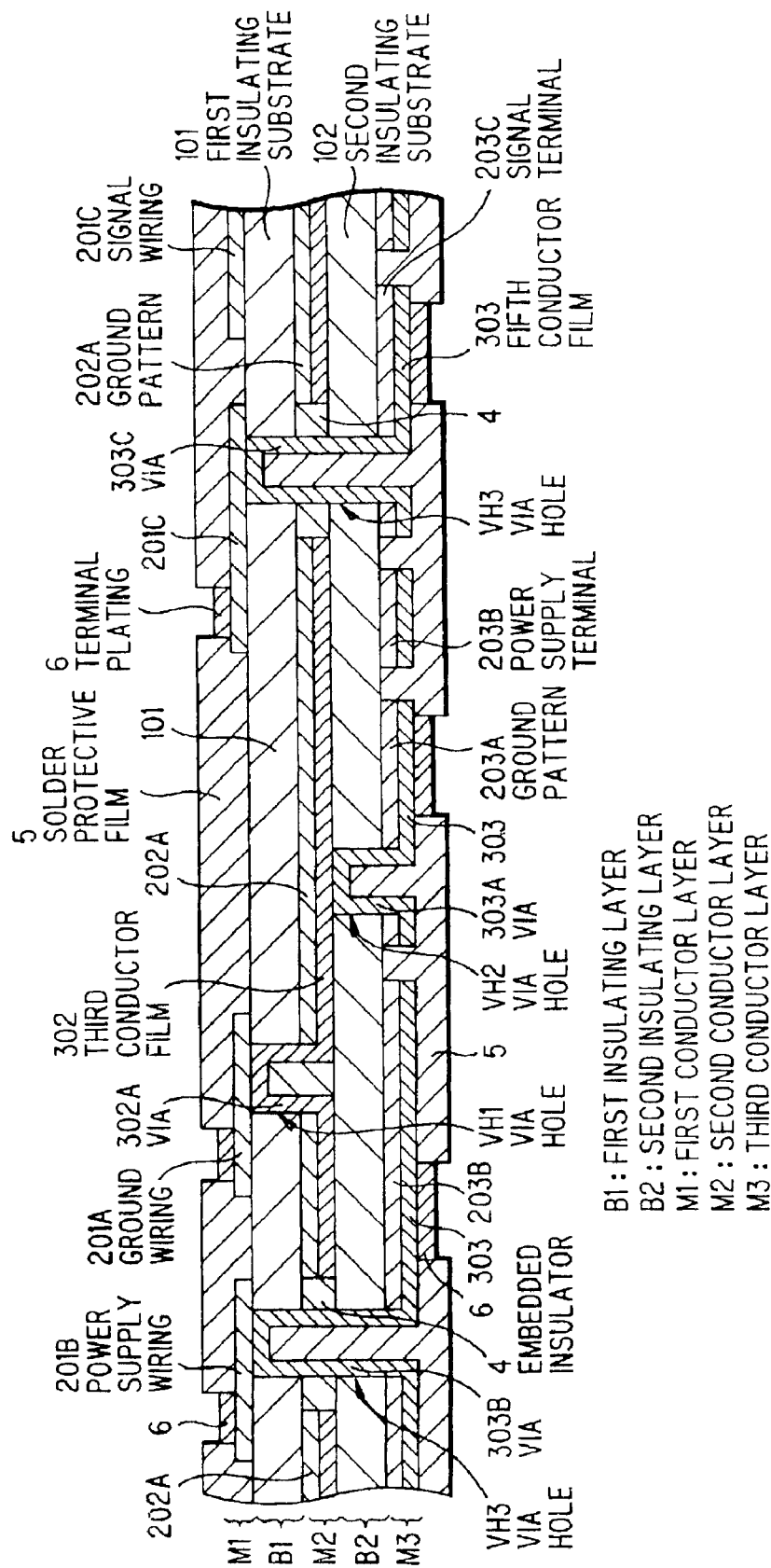
FIG. 5 is a typical schematic cross-sectional view showing the construction of a wiring board according to a first preferred embodiment of the invention, illustrating the features of the wiring board.
Figure 6:
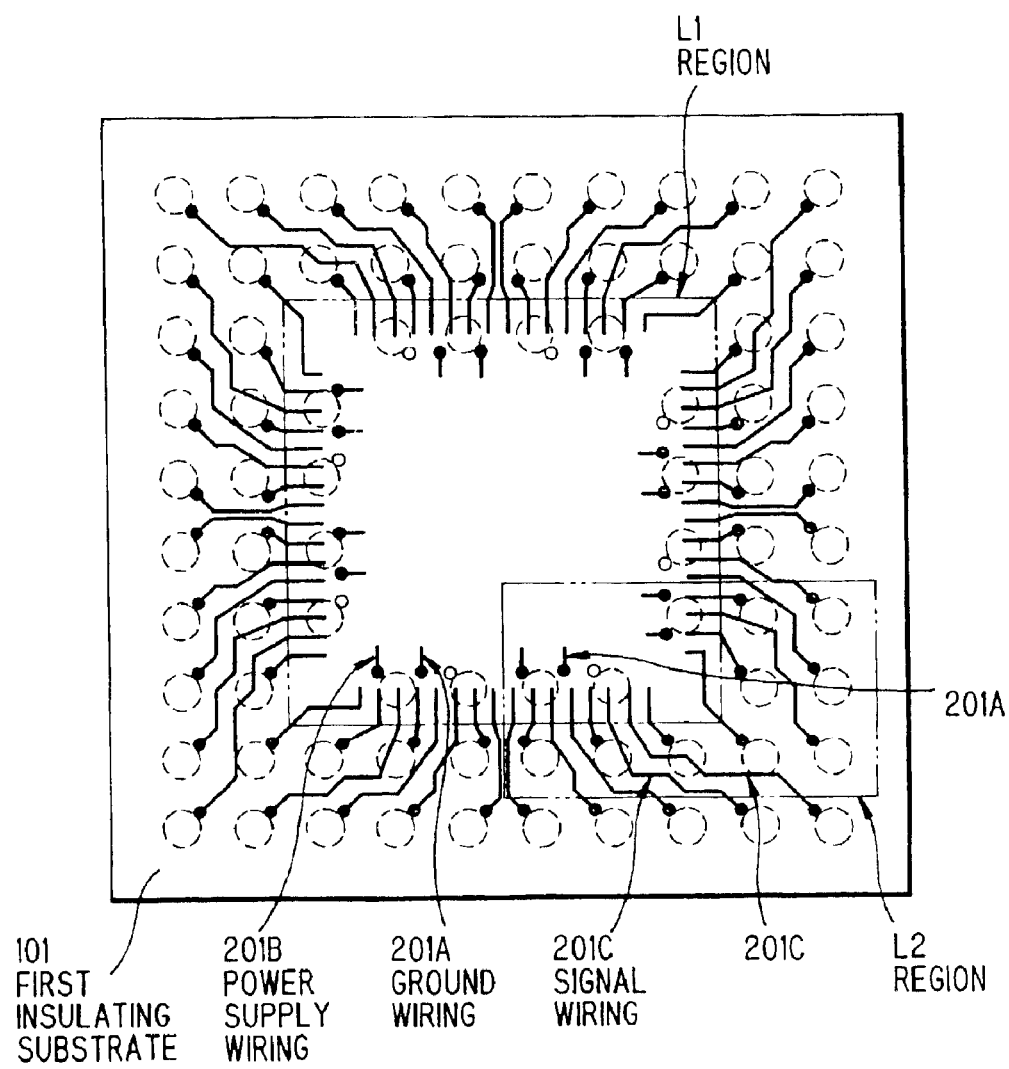
FIG. 6 is a typical schematic plan view showing the construction of the wiring board according to the first preferred embodiment of the invention, illustrating the whole wiring board.
Figure 7:
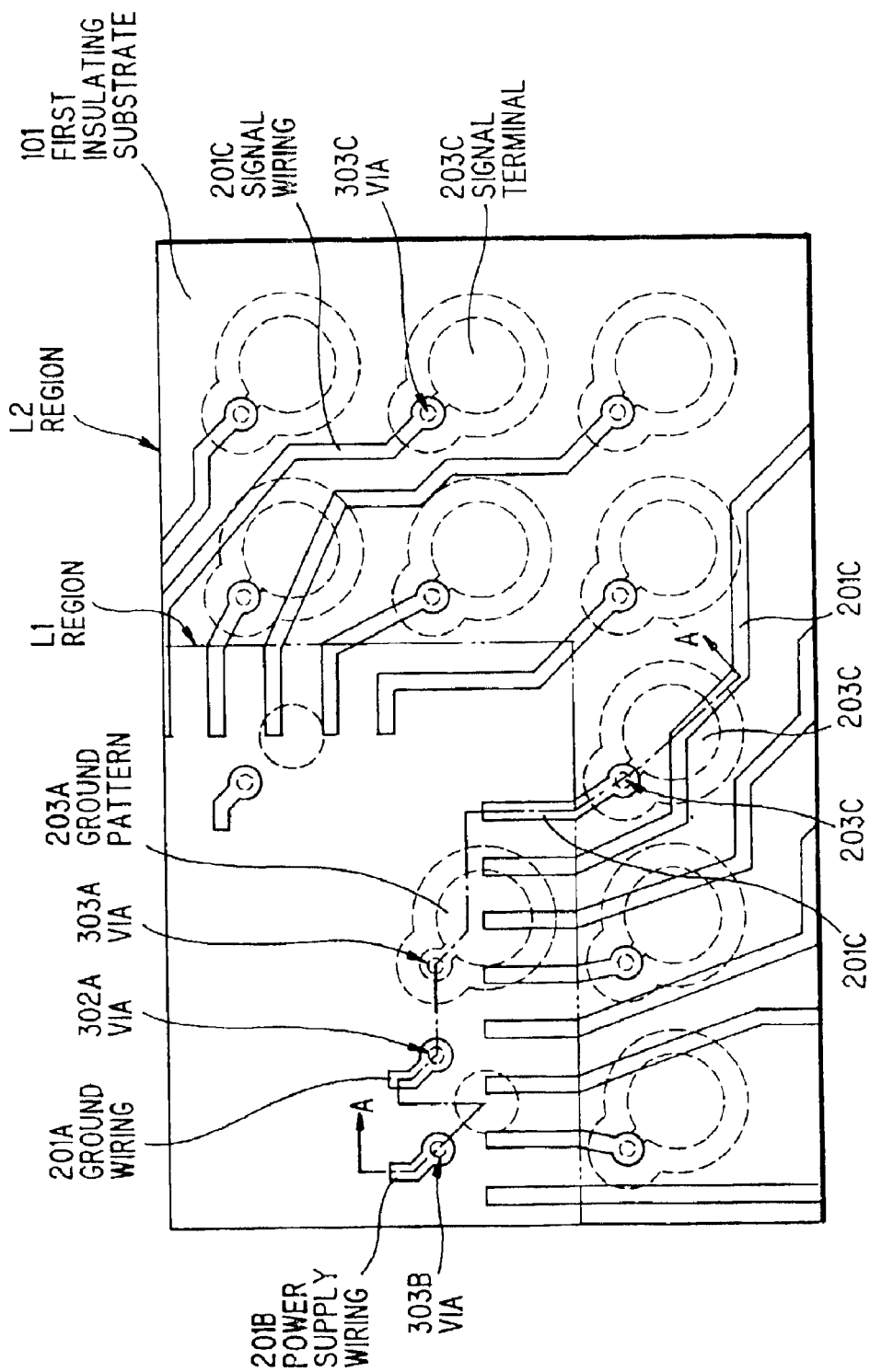
FIG. 7 is a typical schematic enlarged plan view showing the construction of the wiring board according to the first preferred embodiment of the invention, illustrating a region L1 in the wiring board shown in FIG. 6.
Figure 8:
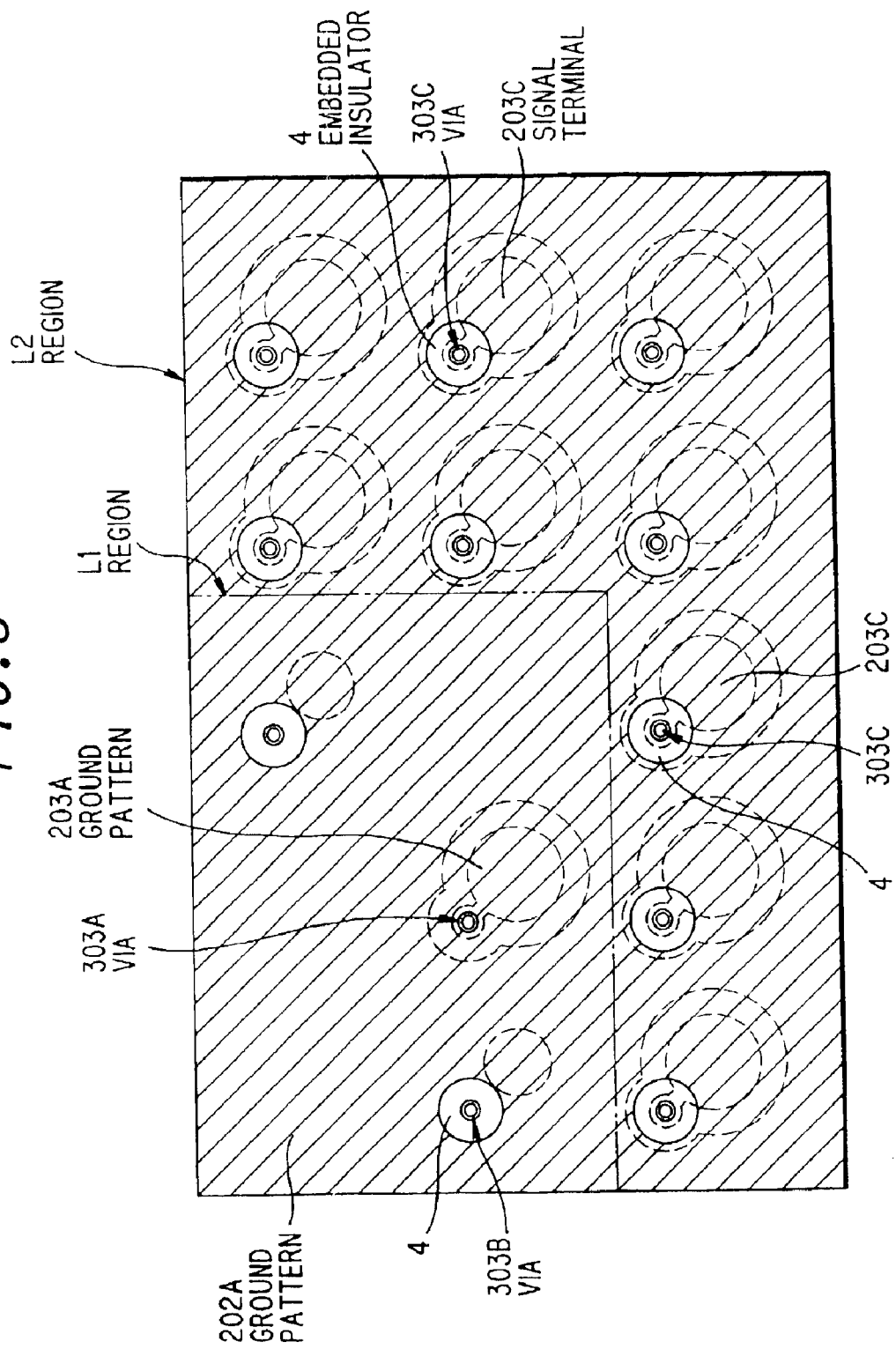
FIG. 8 is a typical schematic plan view showing the construction of the wiring board according to the first preferred embodiment of the invention, illustrating the construction of a second conductor layer in the wiring board shown in FIG. 7.

FIGS. 5 to 9 are typical schematic diagrams showing the construction of a wiring board according to a first preferred embodiment of the invention, wherein FIG. 5 is a cross-sectional view illustrating the features of the wiring board according to the first preferred embodiment of the invention, FIG. 6 a plan view of the wiring board of the first preferred embodiment of the invention as viewed from a first conductor layer side, FIG. 7 an enlarged plan view of a region L1 in the wiring board shown in FIG. 6, FIG. 8 a plan view of a second conductor layer in the region L1 in the wiring board shown in FIG. 6, and FIG. 9 a plan view showing a third conductor layer in the region L1 of the wiring board shown in FIG. 6. FIG. 5 shows a cross section taken on line A–A' of FIG. 7.

In each of FIGS. 5, 6, 7, 8, and 9, numeral M1 designates a first conductor layer, numeral M2 a second conductor layer, numeral M3 a third conductor layer, numeral B1 a first insulating layer, numeral B2 a second insulating layer, numeral 101 a first insulating substrate, numeral 102 a second insulating substrate, numeral 201A a ground wiring, numeral 201B a power supply wiring, numeral 201C a signal wiring, numeral 202A a ground pattern, numeral 203A a ground terminal, numeral 203B a power supply terminal, numeral 203C a signal terminal, numerals 302 and 303 each an electrolytic copper plating, numerals 302A, 303A, 303B, and 303C each a via, numeral 4 an embedded insulator, numeral 5 a solder protective film (a solder resist), and numeral 6 a terminal plating.

As shown in FIG. 5, in the wiring board according to the first preferred embodiment of the invention, the first conductor layer M1 is provided on the first insulating layer B1, formed of the first insulator 101, in its surface, in other words, on a surface on which a semiconductor chip is to be mounted. The second conductor layer M2 is provided on the first insulating layer B1 in its surface remote from the first conductor layer M1. The third conductor layer M3 is provided, through the second insulating layer B2 formed of the second insulator 102, on the surface of the second conductor layer M2 provided on the first insulating layer B1.

The wiring board according to the first preferred embodiment of the invention is an interposer for use in a semiconductor device such as BGA (ball grid array) or CSP (chip size package). As shown in FIGS. 5, 6, and 7, conductor wiring to be connected to an external terminal (a bonding pad) of the semiconductor chip mounted is provided in the first conductor layer M1. In this case, the conductor wiring comprises a conductor wiring 201A for providing a power supply of a ground potential to the semiconductor chip (hereinafter referred to as "ground wiring"), a conductor wiring 201B for providing an operation power supply of a potential different from the potential of the ground potential to the semiconductor chip (hereinafter referred to as "power supply wiring"), and a conductor wiring 201C for transmitting an electric signal (hereinafter referred to as "signal wiring").

Further, as shown in FIG. 5, a conductor pattern 202A connected to the ground wiring 201A (hereinafter referred to as "ground pattern") is provided in the second conductor layer M2. In this case, a first via hole VH1 extended through the first insulating substrate 101 is provided in the first insulating substrate 1 at its position where the ground pattern 202A is connected to the ground wiring 201A. The electrolytic copper plating 302 is provided on the surface of the ground pattern 202A and on the inner wall of the first via hole VH1. That is, the ground pattern 202A is connected to the ground wiring 201A through the electrolytic copper plating (via) 302A provided on the inner wall of the first via hole VH1.

Further, a connection terminal to be connected to a terminal (wiring) in a mounting substrate such as a mother board is provided in the third conductor layer M3. In this case, as shown in FIG. 5, the connection terminal comprises a connection terminal 203A connected to the ground pattern 202A (hereinafter referred to as "ground terminal"), a connection terminal 203B connected to the power supply wiring 201B (hereinafter referred to as "power supply terminal"), and a connection terminal 203C connected to the signal wiring 201C (hereinafter referred to as "signal terminal").

Further, in this case, a second via hole VH2 extended through the second insulating substrate 102 is provided in the second insulating substrate 102 at its position where the ground terminal 203A is connected to the ground pattern 202A. The electrolytic copper plating 303 is provided on the surface of the ground terminal 203A and on the inner wall of the second via hole VH2. That is, the ground terminal 203A is connected to the ground pattern 202A through the via 303A provided on the inner wall of the second via hole VH2.

Further, a third via hole VH3 extended through the second insulating substrate 102 and the first insulating substrate 101 is provided at a position where the power supply terminal 203B is connected to the power supply wiring 201B, and a position where the signal terminal 203C is connected to the signal wiring 201C. The electrolytic copper plating 303 is also provided on the surface of the power supply terminal 203B and the signal terminal 203C and on the inner wall of the third via hole VH3. That is, the power supply terminal 203B is connected directly to the power supply wiring 201B through the via 303B provided on the inner wall of the third via hole VH3, and the signal terminal 203C is connected directly to the signal wiring 201C through the via 303C provided on the inner wall of the third via hole VH3.

As shown in FIG. 8, the ground pattern 202A provided in the second conductor layer M2 is spread over the whole area except for the region around the via 303B for connecting the power supply wiring 201B to the power supply terminal 203B and the via 303C for connecting the signal wiring 201C to the signal terminal 203C, whereby a microstrip composed of the signal wiring 201A, the first insulating substrate 101, and the ground pattern 202A is provided. In this case, as shown in FIGS. 5 and 8, the portion between each of the via 303B for connecting the power supply terminal 203B to the power supply wiring 201B and the via 303C for connecting the signal terminal 203C to the signal wiring 201C and the ground pattern 202A is filled with the insulator 4 to separate the vias 303B, 303C from the ground pattern 202A. Likewise, the inside of the via 302A for connecting the ground pattern 202A to the ground wiring 201A is also filled with the insulator 4.

As shown in FIG. 9, the power supply terminal 203B provided in the third conductor layer M3 is spread over the whole area except for the circumference of the ground terminal 203A and the signal terminal 203C.

Further, as shown in FIG. 5, in the surface (exposed surface) of the first conductor layer M1, the solder protective film (solder resist) 5 is provided so that a region, where each conductor wiring is connected to the external terminal of the semiconductor chip, is opened. A terminal plating 6 such as a gold plating is provided on the exposed surface of each conductor wiring. Likewise, as shown in FIGS. 5 and 9, in the surface of the third conductor layer M3, the solder protective film 5 is provided so that a region L3 for connection to the connection terminal (wiring) in a mounting substrate, such as a mother board, or other external devices, is opened. The terminal plating 6 is provided on the exposed surface of each connection terminal.

The wiring board according to the first preferred embodiment of the invention is a wiring board (an interposer) for use in a semiconductor device (package) such as BGA (ball grid array) or CSP (chip size package), for matching between the external terminal of the semiconductor chip and the connection terminal (wiring) in the mounting substrate, or for grid conversion. A ball terminal formed of an Sn—Pb-base solder or the like is provided in the region L3, as shown in FIG. 9, provided with the terminal plating 6 of the power supply layer.

In the wiring board according to the first preferred embodiment of the invention, the ground terminal 203A and the power supply terminal 203B are provided on the inside of the signal terminal 203C to reduce the wiring length and thus to reduce operation failure caused by voltage drop or the like.

FIGS. 10 to 14 are typical cross-sectional views illustrating a production process of the wiring board according to the first preferred embodiment of the invention, wherein FIGS. 10A, 10B, 10C, 11A, 11B, 11C, 12A, 12B, 13A, 13B, 14 are cross-sectional views in each step of the production process as viewed in the cross-sectional view of FIG. 7.

The production process of the wiring board according to the first preferred embodiment of the invention will be explained in conjunction with FIGS. 10 to 14.

As shown in FIG. 10A, a laminate plate (a copper double clad laminate plate) is first provided wherein a first conductor film 201' is provided on the first main surface of a first insulator 101 and a second conductor film 202' is provided on the second main surface of the first insulator 101. In this case, the first insulator 101 is preferably formed of a thin material having low permittivity from the viewpoint of providing satisfactory microstrip effect. For example, a polyimide tape having a thickness of about 25 $\mu$m is used. The first conductor film 201' and the second conductor film 202' are formed, for example, by bonding a copper foil, such as an electrolytic copper foil or a rolled copper foil, onto the surface of the first insulator 101, or by forming a thin film on the surface of the first insulating layer by sputtering or the like. Further, in this case, the thickness of each of the first conductor film 201' and the second conductor film 202' may be, for example, about 12 μm.

Next, as shown in FIG. 10B, the second conductor film 202' at its predetermined position is opened, and, as shown in FIG. 10C, a first via hole VH1 is formed in the first insulator 101. In this case, the first via hole VH1 is formed at the position, shown in FIG. 5, where the ground wiring 201A is connected to the ground pattern 202A, for example, by laser beam machining using carbonic gas laser, excimer laser or the like, or by etching.

Next, as shown in FIG. 11A, for example, an about 10 μm-thick third conductor film 302 is formed on the surface of the second conductor film 202' and within the first via hole VH1. In this case, the third conductor film 302 is formed, for example, by electrolytic copper plating.

Next, as shown in FIG. 11B, the third conductor film (electrolytic copper plating) 302 and the second conductor film 202' are etched to form the ground pattern 202A, and, as shown in FIG. 11C, the opening in the ground pattern 202 and the inside of the via are then filled with the insulator 4 to flatten the surface. In this case, the ground pattern 202A is formed by etching in such a manner that, as shown in FIG. 8, the circumference of the region, where the via 303B for connecting the power supply wiring 201B to the power supply terminal 203B and the via 303C for connecting the signal wiring 201C to the signal terminal 203C are formed, is opened.

Next, as shown in FIG. 12A, a fourth conductor film 203' is formed on the surface of the ground pattern 202A through the second insulator 102. In this case, for example, a method is used wherein an about 12 μm-thick copper foil such as an electrolytic copper foil or a rolled copper foil is provided as the fourth conductor film 203', an uncured thermosetting resin, such as a polyimide, is coated as the second insulator 102 on the surface of the fourth conductor film (copper foil) 203', the curing reaction is allowed to proceed to a half stage, and the assembly is then bonded to the surface of the ground pattern 202A.

Next, as shown in FIG. 12B, the fourth conductor film 203' at its predetermined position is opened, and, as shown in FIG. 13A, the second via hole VH2 extended through the second insulator 102 to the ground pattern 202A and the third via hole VH3 extended through the second insulator 102, the embedded insulator 4, and the first insulator 101 to the first conductor film 201' are formed. The second via hole VH2 and the third via hole VH3 are preferably formed, for example, by carbonic gas laser beam etching, using the fourth conductor film 203' having an opening at its predetermined position as a mask as shown in FIG. 12B. The etching by the carbonic gas laser selectively etches the insulator and does not etch the metal film and the like. Therefore, the first insulator 101, the second insulator, and the embedded insulator 4 can be selectively etched. By virtue of this, when etching is carried out based on the depth of the third via hole VH3 having larger depth, the formation of the second via hole VH2 by etching is ended when the via hole reaches the ground pattern 202A (third conductor film 302). Thus, the second via hole VH2 and the third via hole VH3 different from each other in depth can be simultaneously formed.

Next, as shown in FIG. 13B, an about 10 μm-thick fifth conductor film 303 is formed on the surface of the fourth conductor film 203', on the inner wall of the second via hole VH2, and on the inner wall of the third via hole VH3. The fifth conductor film 303 may be formed, for example, by electrolytic copper plating.

Figure 14:
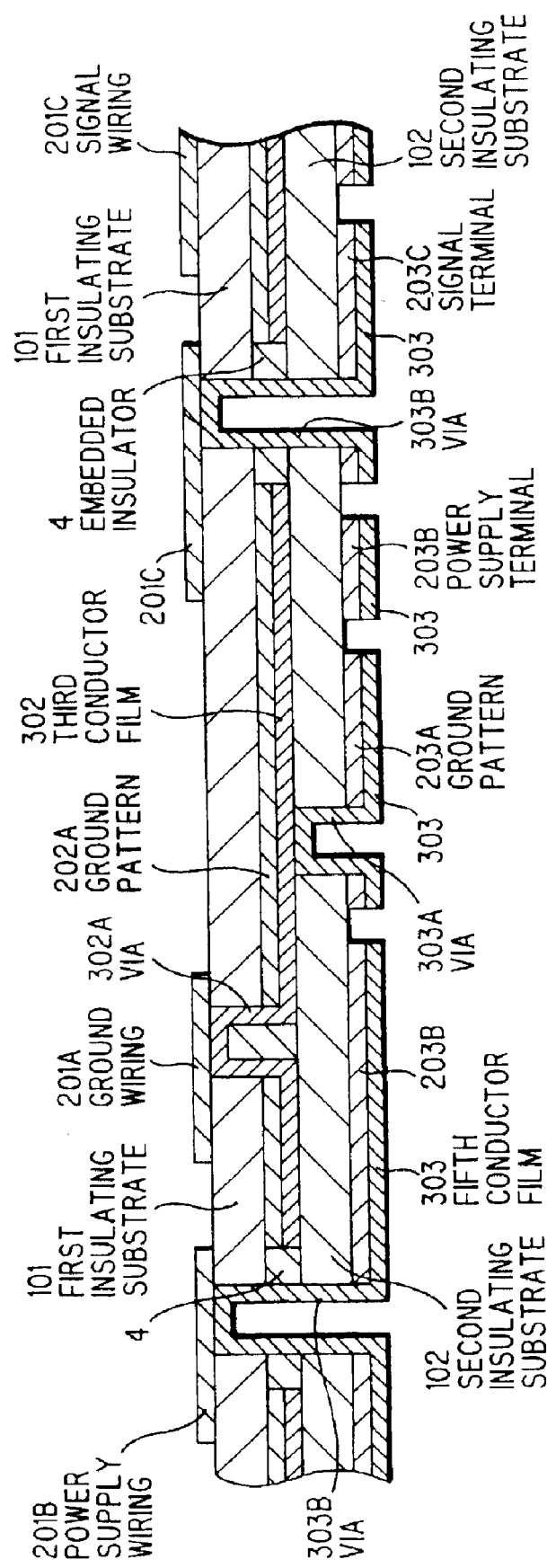

Next, as shown in FIG. 14, the first conductor film 201' is etched to form the ground wiring 201A, the power supply wiring 201B, and the power supply wiring 201C, and the fourth conductor 203' and the fifth conductor film (electrolytic copper plating) 303 on the surface of the fourth conductor 203' are etched to form the ground terminal 203A, the power supply terminal 203B, and the signal terminal 203C.

In this case, as shown in FIG. 9, the power supply terminal 203B is spread over the whole area of the region except for the circumference of the ground terminal 203A and the signal terminal 203C.

Thereafter, as shown in FIG. 7, a solder protective film 5 is formed in such a manner that a predetermined region L3 on each conductor wiring of the first conductor layer M1 and a predetermined region L3 of each connection terminal of the third conductor layer M3 are opened. For example, a terminal plating 6 such as a gold plating is formed on the exposed surface of each conductor wiring and each connection terminal. Thus, the wiring board according to the first preferred embodiment of the invention is prepared.

Figure 15:
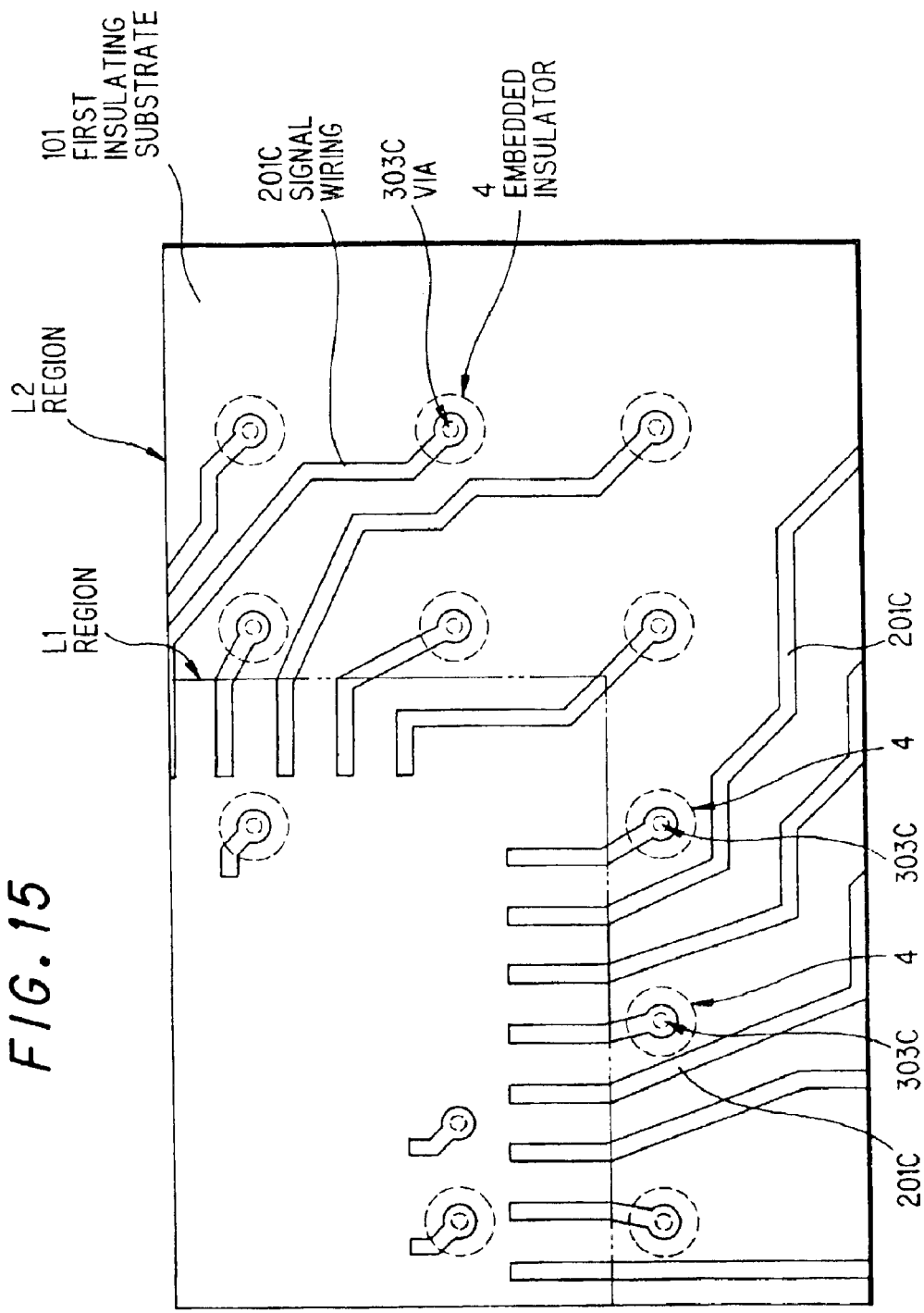
FIG. 15 is a typical plan view illustrating the function and effect of the wiring board according to the first preferred embodiment of the invention.

FIG. 15 is a typical plan view illustrating the function and effect of the wiring board according to the first preferred embodiment of the invention.

As shown in FIG. 5, the wiring board according to the first preferred embodiment of the invention is a wiring board having three conductor layers of the first conductor layer M1, the second conductor layer M2, and the third conductor layer M3. As shown in FIG. 8, the second conductor layer M2 comprises a flat conductor pattern (a ground pattern) 202A wherein only the circumference of the via 303B for connecting the power supply wiring 201B to the power supply terminal 203B and the via 303C for connecting the signal wiring 201C to the signal terminal 203C is opened.

The size of the opening formed in the ground pattern 202A may be such that the ground pattern 202A does not come into contact with the vias 303B, 303C. Therefore, as shown in FIG. 15, the conductor wiring formed in the first conductor layer M1, particularly the signal wiring 201C, can be formed so as not to pass over the opening in the ground pattern 202A, that is, over the embedded insulator. By virtue of this construction, unlike the conventional wiring board provided with two conductor layers, the passage of the signal wiring 201C over the power supply terminal 202B and the signal terminal 202C can be avoided, and, in all the sections of the signal wiring 201C, the effect of a microstrip comprising the signal wiring 201C, the first insulator 101, and the ground pattern 202A can be satisfactorily attained. This facilitates the control of characteristic impedance. Further, since the effect of the microstrip can be satisfactorily attained to facilitate the control of the characteristic impedance, noise is less likely to occur in electric signals which flow through the signal wiring 201C, contributing to a reduction in a deterioration level of high frequency characteristics.

Figure 16A:
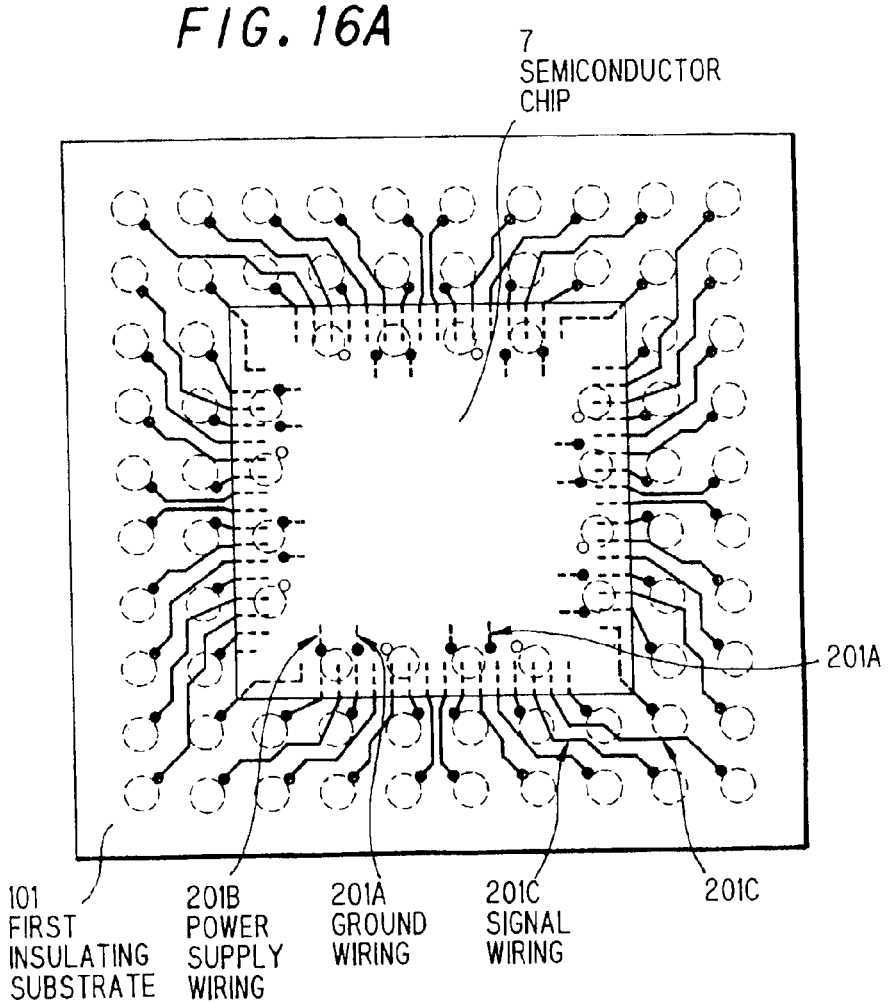
FIG. 16A is a plan view of the whole semiconductor device and FIG. 16B a front view of the semiconductor device shown in FIG. 16A.
Figure 16B:
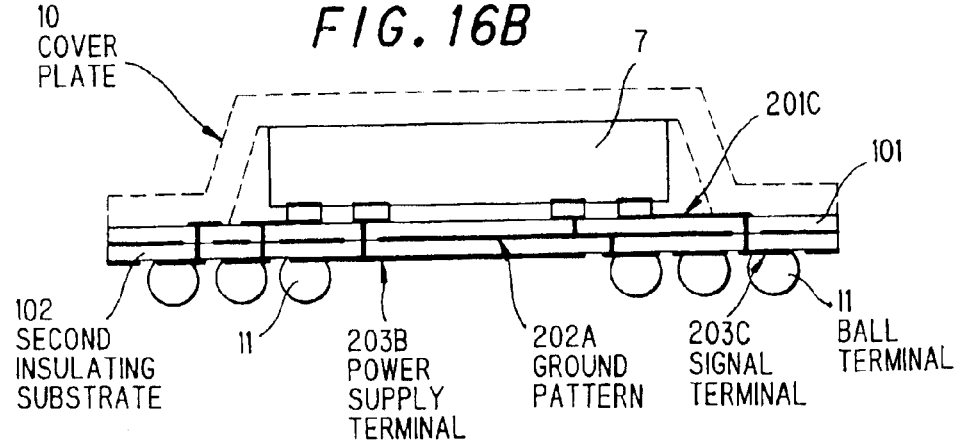
Figure 17:
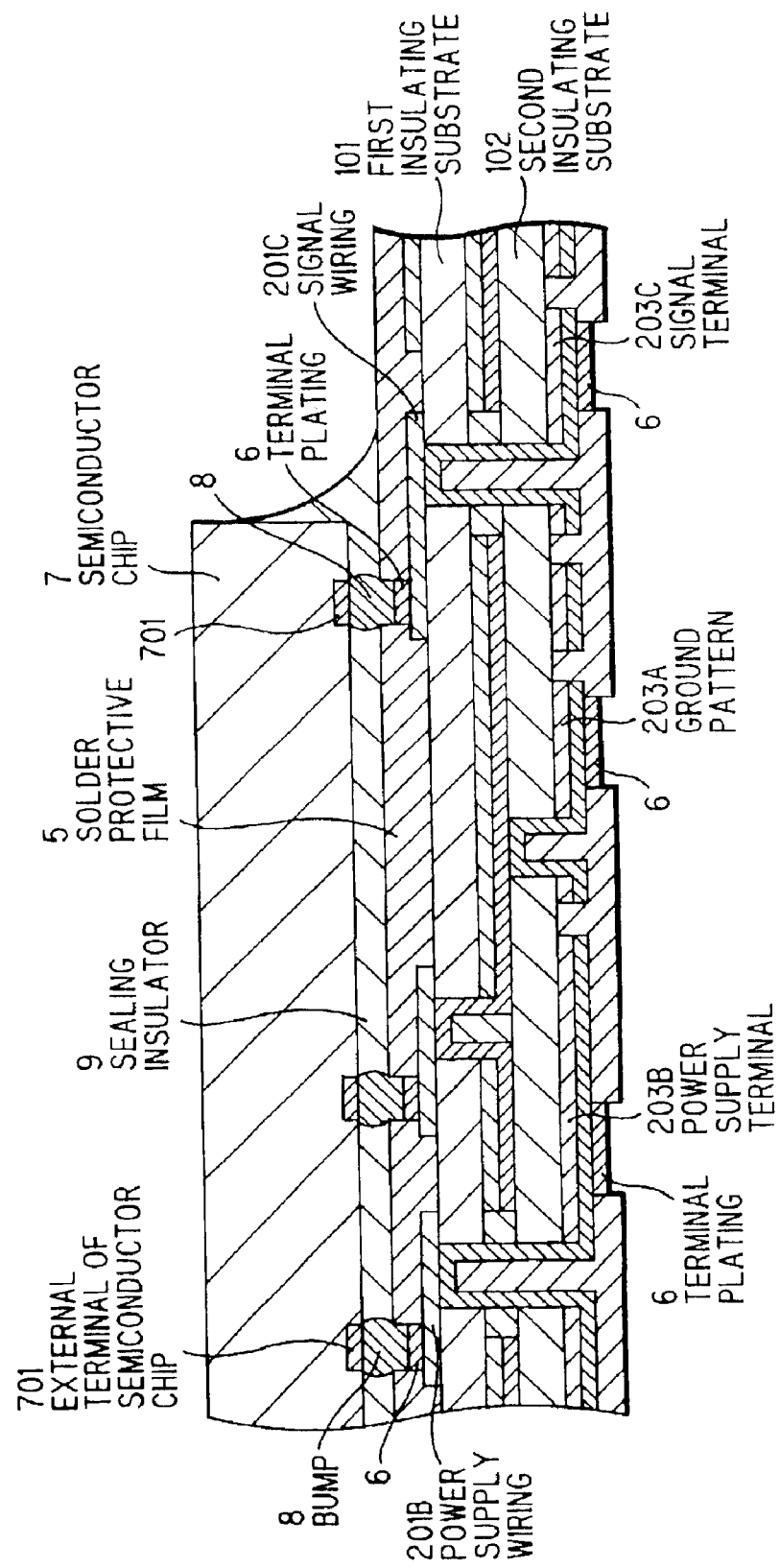
FIG. 17 is a typical schematic cross-sectional view showing the construction of a semiconductor device using the wiring board according to the first preferred embodiment of the invention, illustrating the internal construction of the semiconductor device shown in FIG. 16A.

FIGS. 16 and 17 are typical schematic diagrams showing the construction of a semiconductor device using the wiring board according to the first preferred embodiment of the invention, wherein FIG. 16A is a plan view of the semiconductor device, FIG. 16B a side view of the semiconductor device shown in FIG. 15A, and FIG. 17 a cross-sectional view showing the internal construction of the semiconductor device.

The wiring board according to the first preferred embodiment of the invention is used as an interposer for semiconductor devices such as BGA and CSP, and, as shown in FIGS. 16A, 16B, and 17, a semiconductor chip 7 is flip chip connected to the wiring board in its first conductor layer M1 side, that is, on the side on which the ground wiring 201A, the power supply wiring 201B, and the signal wiring 201C have been provided. In this case, the connection may be carried out, for example, by previously forming, for example, a bump 8 of a high-melting solder on an external terminal (a bonding pad) 701 in the semiconductor chip 7, previously coating a low-melting solver (not shown) on the surface of the terminal plating 6 provided on each conductor wiring of the wiring board, and thermocompression bonding the external terminal 701 to the terminal plating 6.

Further, a sealing insulator 9, such as an uncured thermosetting resin, is poured into between the wiring board and the semiconductor chip 7, and the resin is then cured to perform underfill sealing. Further, since the wiring board is very thin and has low strength, the outer side of the region, where the semiconductor chip 7 has been mounted, is likely to be deformed, as shown in FIG. 16B, the semiconductor chip 7 is covered with a metallic cover plate 10, and, in addition, the wiring board is reinforced.

Further, as shown in FIG. 16B, for example, a ball terminal 11 formed of an Sn—Pb-base solder or the like is connected to each of the ground terminal 201A, the power supply terminal 201B, and the signal terminal 201C provided in the third conductor layer M3 of the wiring board.

As described above, according to the wiring board according to the first preferred embodiment of the invention, three conductor layers of the first conductor layer M1, the second conductor layer M2, and the third conductor layer M3 are provided, conductor wiring connected to the external terminal of a semiconductor chip is provided in the first conductor layer M1, a conductor pattern (a ground pattern) 202A connected to a conductor wiring (a ground wiring) 201A, for providing a power supply of ground potential, among the conductor wirings in the first conductor layer is provided in the second conductor layer M2, and a connection terminal connected to the terminal (wiring) of the mounting substrate is provided in the third conductor layer. According to this construction, the area of the ground pattern 202A provided in the second conductor layer M2 can be increased. This permits the conductor wiring (signal wiring) 201C for transmitting electric signals in the first conductor layer M1 to pass over the ground pattern 202A in all the sections. Consequently, the effect of the microstrip comprising the signal wiring 201C, the first insulator 101, and the ground pattern 202A can be satisfactorily attained to facilitate the control of the characteristic impedance. Further, since the control of the characteristic impedance becomes easy, noise is less likely to occur in electric signals which flow through the signal wiring 201C, contributing to the prevention of a deterioration in high frequency characteristics.

Further, the via 303B for connecting the power supply wiring 201B provided in the first conductor layer M1 to the power supply terminal 203B provided in the third conductor layer M3 and the via 303C for connecting the signal wiring 201C provided in the first conductor layer M1 to the signal terminal 203C provided in the third conductor layer M3 are provided on the inner wall of the third via hole VH3 which passes through the first insulator 101, the embedded insulator 4, and the second insulator 102 to realize direct connection of the power supply wiring 201B to the power supply terminal 203B and direct connection of the signal wiring 201C to the signal terminal 203C. As compared with, for example, stack via connection, the number of steps required for the production process can be reduced, and, a lowering in connection reliability caused, for example, by misregistration in stacking of vias in two or more stages can be eliminated. Therefore, a wiring board having high connection reliability can be produced at low cost.

Further, when the via 303B for connecting the power supply wiring 201B provided in the first conductor layer M1 to the power supply terminal 203B provided in the third conductor layer M3 and the via 303C for connecting the signal wiring 201C provided in the first conductor layer M1 to the signal terminal 203C provided in the third conductor layer M3 are provided on the inner wall of the third via hole VH3 which passes through the first insulator 101, the embedded insulator 4, and the second insulator 102 to realize direct connection of the power supply wiring 201B to the power supply terminal 203B and direct connection of the signal wiring 201C to the signal terminal 203C, as compared with stack via connection, the area of the opening formed in the ground pattern 202A can be reduced and the possibility of passage of the signal wiring 201C over the opening in the ground pattern 202A can be further reduced to prevent a deterioration in high frequency characteristics of electric signals.

Further, when the via 303B for connecting the power supply wiring 201B provided in the first conductor layer M1 to the power supply terminal 203B provided in the third conductor layer M3 and the via 303C for connecting the signal wiring 201C provided in the first conductor layer M1 to the signal terminal 203C provided in the third conductor layer M3 are provided on the inner wall of the third via hole VH3 which passes through the first insulator 101, the embedded insulator 4, and the second insulator 102 to realize direct connection of the power supply wiring 201B to the power supply terminal 203B and direct connection of the signal wiring 201C to the signal terminal 203C and thus to reduce the area of the opening in the ground pattern 202A, the spacing between the vias 303B, 303C can be narrowed and, thus, a reduction in size of the wiring board and higher density conductor wiring can be easily realized.

Further, when, among the connection terminals provided in the third conductor layer M3, the power supply terminal 203B is spread over the whole region except for the circumference of the ground terminal 203A and the signal terminal 203C, the function as an inductor, when a high frequency signal has flowed through the signal wiring 201C, can be reduced.

Figure 18:
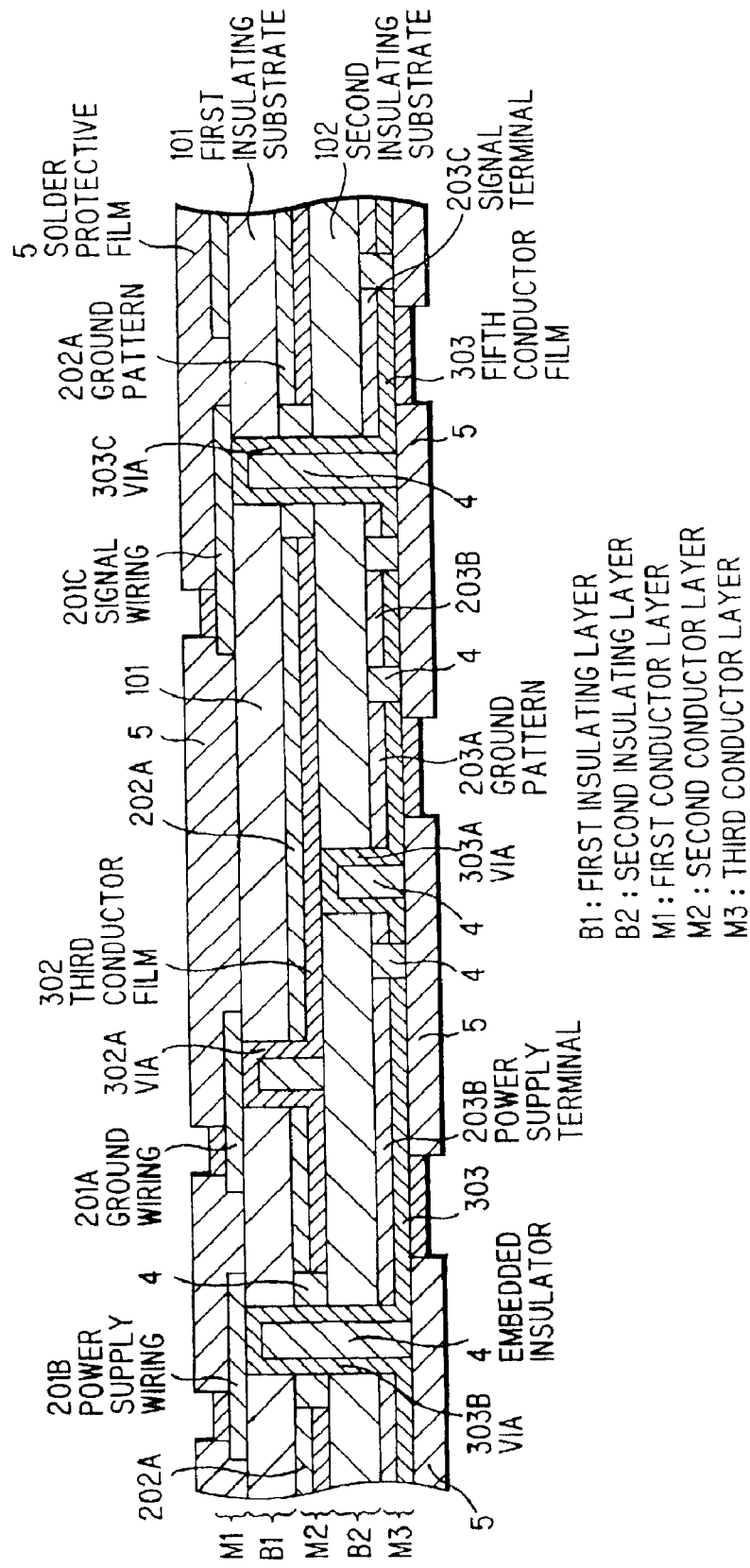
FIG. 18 is a typical cross-sectional view showing a variant of the wiring board according to the first preferred embodiment of the invention.

FIG. 18 is a typical cross-sectional view illustrating a variant of the wiring board according to the first preferred embodiment of the invention. FIG. 18 shows the same cross section as in FIG. 5.

In the wiring board according to the first preferred embodiment of the invention, as shown in FIG. 14, the ground wiring 201A, the power supply wiring 201B, and the signal wiring 201C are formed in the first conductor layer M1, and the ground terminal 203A, the power supply terminal 203B, and the signal terminal 203C in the third conductor layer M3 are formed, followed by the formation of the solder protective film 5 on the surface of the first conductor layer M1 and on the surface of the third conductor layer M3. Alternatively, for example, before the formation of the solder protective film 5 on the surface of the third conductor layer M3, the insulator 4 may be embedded in the portion for separating the connection terminals in the third conductor layer M3 and within the vias.

For example, as in the wiring board according to the first preferred embodiment of the invention, when the solder protective film 5 is directly formed after the formation of each connection terminal of the third conductor layer M3, there is a possibility that bubbles occur in the interior of deep vias such as the via 303B for connecting the power supply wiring 201B to the power supply terminal 203B and the via 303C for connecting the signal wiring 201C to the signal terminal 203C. In this case, for example, when the semiconductor device is operated and the semiconductor chip or the wiring board is brought to high temperature due to unsatisfactory heat radiation, for example, from a cover plate 10 as shown in FIG. 16B, the bubbles are expanded, often leading to cracking in the vias or breaking of wiring which deteriorates electrical characteristics. To solve this problem, as shown in FIG. 18, the insulator 4 is embedded to prevent the formation of bubbles within the vias and thus to prevent a deterioration in electrical characteristics.

Second Preferred Embodiment

Figure 19:
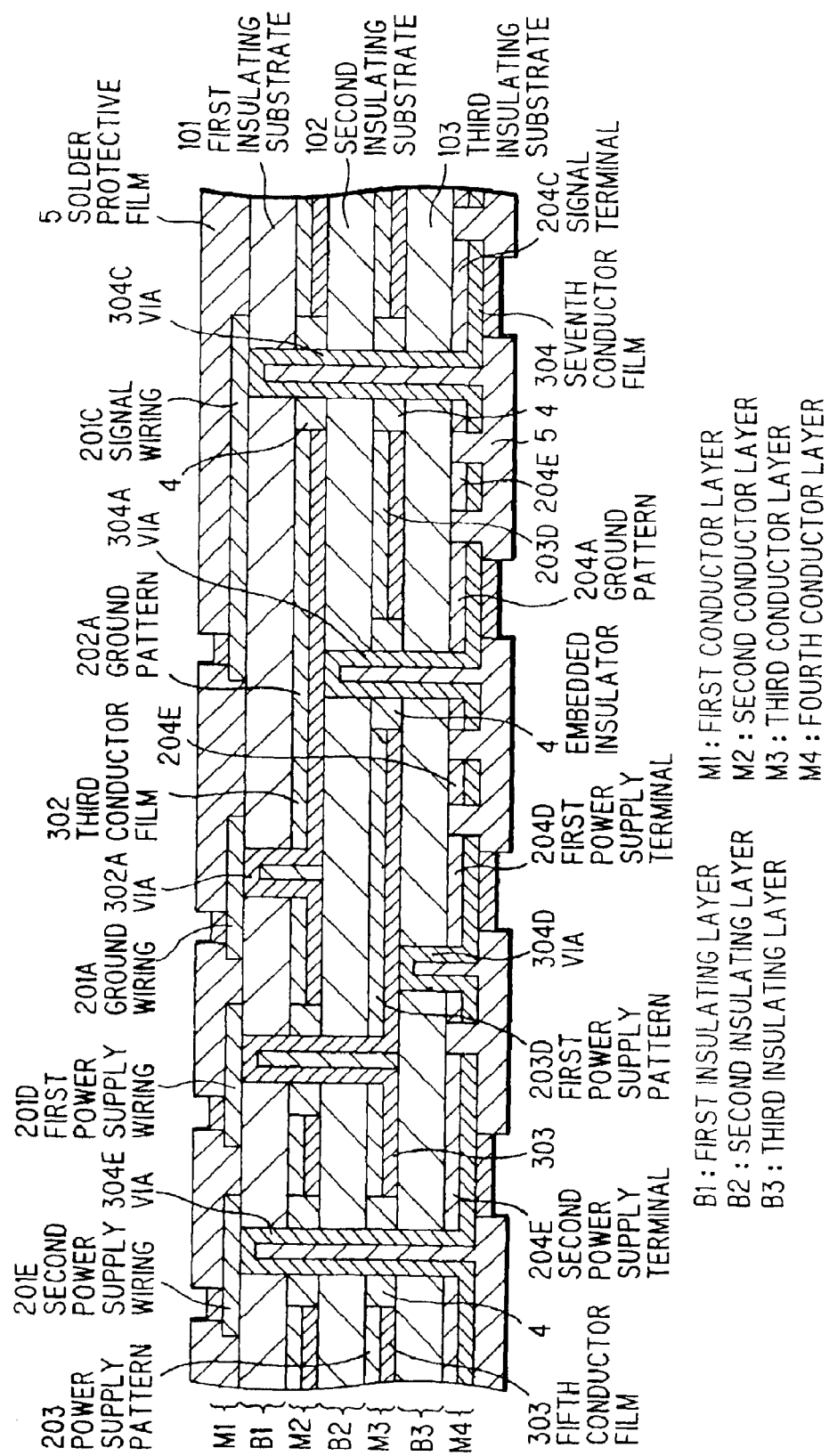
FIG. 19 is a typical schematic cross-sectional view showing the construction of a wiring board according to a second preferred embodiment of the invention.

FIG. 19 is a typical schematic cross-sectional view showing the construction of a wiring board according to a second preferred embodiment of the invention.

In FIG. 19, numeral M1 designates a first conductor layer, numeral M2 a second conductor layer, numeral M3 a third conductor layer, numeral M4 a fourth conductor layer, numeral B1 a first insulating layer, numeral B2 a second insulating layer, numeral B3 a third insulating layer, numeral 101 a first insulating substrate, numeral 102 a second insulating substrate, numeral 103 a third insulating substrate, numeral 201A a ground wiring, numeral 201C a signal wiring, numeral 201D a first power supply wiring, numeral 201E a second power supply wiring, numeral 202A a ground pattern, numeral 203D a first power supply pattern, numeral 204A a ground terminal, numeral 204C a signal terminal, numeral 204D a first power supply terminal, numeral 204E a second power supply terminal, numerals 302, 303, 304 each an electrolytic copper plating, numerals 302A, 303D, 304A, 304C, 304D, 304E each a via, numeral 4 an embedded insulator, numeral 5 a solder protective film (a solder resist), and numeral 6 a terminal plating.

As shown in FIG. 19, in the wiring board according to the second preferred embodiment of the invention, the first conductor layer M1 is provided on the first insulating layer B1, formed of the first insulator 101, in its surface, in other words, on a surface on which a semiconductor chip is to be mounted. The second conductor layer M2 is provided on the first insulating layer B1 in its surface remote from the first conductor layer M1. The third conductor layer M3 is provided, through the second insulating layer B2 formed of the second insulator 102, on the surface of the second conductor layer M2 provided on the first insulating layer B1, and the fourth conductor layer M4 formed of the third insulator 103 is provided on the surface of the third conductor layer M3.

As with the wiring board according to the first preferred embodiment of the invention, the wiring board according to the second preferred embodiment of the invention is an interposer for use in a semiconductor device such as BGA or CSP. As shown in FIG. 19, conductor wiring to be connected to an external terminal (a bonding pad) of the semiconductor chip mounted is provided in the first conductor layer M1. In this case, the conductor wiring comprises a conductor wiring 201A for providing a power supply of a ground potential to the semiconductor chip (hereinafter referred to as "ground wiring"), a conductor wiring 201D for providing an operation power supply of a first potential different from the potential of the ground potential to the semiconductor chip (hereinafter referred to as "first power supply wiring"), a conductor wiring 201E for providing an operation power supply of a second potential different from the ground potential and the first potential to the semiconductor chip (hereinafter referred to as "second power supply wiring"), and a conductor wiring 201C for transmitting an electric signal (hereinafter referred to as "signal wiring"). In this case, the potential of the operation power supply provided through the first power supply wiring 201D is, for example, 1.8 V (volts), and the potential of the operation power supply provided through the second power supply wiring 201E is, for example, 3.3 V (volts).

Further, as shown in FIG. 19, a conductor pattern 202A connected to the ground wiring 201A (hereinafter referred to as "ground pattern") is provided in the second conductor layer M2. In this case, a first via hole VH1 extended through the first insulating substrate 101 is provided in the first insulating substrate 101 at its position where the ground pattern 202A is connected to the ground wiring 201A. The electrolytic copper plating 302 is provided on the surface of the ground pattern 202A and on the inner wall of the first via hole VH1. That is, the ground pattern 202A is connected to the ground wiring 201A through the electrolytic copper plating (via) 302A provided on the inner wall of the first via hole VH1.

Further, as shown in FIG. 19, a conductor pattern 203D connected to the first power supply wiring 201D (hereinafter referred to as "first power supply pattern") is provided in the third conductor layer M3. In this case, a second via hole VH2 extended through the first insulating substrate 101 and the second insulating substrate 102 is provided at a position where the first power supply pattern 203D is connected to the first power supply wiring 201D. The electrolytic copper plating 303 is provided on the surface of the first power supply pattern 203D and on the inner wall of the second via hole VH2. That is, the first power supply pattern 203D is connected to the first power supply wiring 201D through the electrolytic copper plating (via) 303D provided on the inner wall of the second via hole VH2.

Further, a connection terminal to be connected to a terminal (wiring) in a mounting substrate such as a mother board is provided in the fourth conductor layer M4. In this case, as shown in FIG. 19, the connection terminal comprises a connection terminal 204A connected to the ground pattern 202A (hereinafter referred to as "ground terminal"), a connection terminal 204D connected to the first power supply wiring 201D (hereinafter referred to as "first power supply terminal"), a connection terminal 204E connected to the second power supply wiring 201E (hereinafter referred to as "second power supply terminal"), and a connection terminal 204C connected to the signal wiring 201C (hereinafter referred to as "signal terminal").

Further, in this case, a third via hole VH3 extended through the second insulating substrate 102 and the third insulating substrate 103 is provided at a position where the ground terminal 204A is connected to the ground pattern 202A. The electrolytic copper plating 304 is provided on the surface of the ground terminal 204A and on the inner wall of the third via hole VH3. That is, the ground terminal 204A is connected to the ground pattern 202A through the via 304A provided on the inner wall of the third via hole VH3.

Further, a fourth via hole VH4, which extends through the third insulating substrate 103, is provided at a position where the first power supply terminal 204D is connected to the first power supply pattern 203D, and the electrolytic copper plating 304 is provided on the surface of the first power supply terminal 204D and on the inner wall of the fourth via hole VH4. That is, the first power supply terminal 204D is connected to the first power supply pattern 203D through the via 304D provided on the inner wall of the fourth via hole VH4.

Further, a fifth via hole VH5 extended through the third insulating substrate 103, the second insulating substrate 102, and the first insulating substrate 101 is provided at a position where the second power supply terminal 204E is connected to the second power supply signal 201E, and a position where the signal terminal 204C is connected to the signal wiring 201C. The electrolytic copper plating 304 is also provided on the surface of the second power supply terminal 204E and the signal terminal 204C and on the inner wall of the fifth via hole VH5. That is, the second power supply terminal 204E is connected to the second power supply wiring 201E through the via 304E provided on the inner wall of the fifth via hole VH5, and the signal terminal 204C is connected to the signal wiring 201C through the via 304C provided on the inner wall of the fifth via hole VH5.

The ground pattern 202A provided in the second conductor layer M2 is the same as the ground pattern in the wiring board according to the first preferred embodiment of the invention and is spread over the whole region except for the circumference of the via 303D for connecting the first power supply wiring 201D to the first power supply pattern 203D, the via 304E for connecting the second power supply wiring 201E to the second power supply terminal 204E, and the via 304C for connecting the signal wiring 201C to the signal terminal 204C, whereby a microstrip composed of the signal wiring 201C, the first insulating substrate 101, and the ground pattern 202A is provided.

In this case, as shown in FIG. 19, the portion between each of the via 303D for connecting the first power supply pattern 203D to the first power supply wiring 201D, the via 304E for connecting the second power supply terminal 204E to the second power supply wiring 201E, and the via 304C for connecting the signal terminal 204C to the signal wiring 201C and the ground pattern 202A is filled with the insulator 4 to separate the vias from the ground pattern 202A. Likewise, the inside of the via 302A for connecting the ground pattern 202A to the ground wiring 201A is also filled with the insulator 4.

As with the power supply terminal 203E in the wiring board according to the first preferred embodiment of the invention, the second power supply terminal 204E provided in the fourth conductor layer M4 is spread over the whole region except for the circumference of the ground terminal 204A, the first power supply terminal 204D, and the signal terminal 204C.

Further, as shown in FIG. 19, in the surface (exposed surface) of the first conductor layer M1, the outside of the region, where each conductor wiring is connected to the external terminal of the semiconductor chip, is protected by the solder protective film (solder resist). A terminal plating 6 such as a gold plating is provided on the exposed surface of each conductor wiring. Likewise, in the surface of the fourth conductor layer M4, the outside of the region connected to the connection terminal (wiring) in a mounting substrate, such as a mother board, or other external devices, is protected by the solder protective film 5, and the terminal plating 6 is provided on the exposed surface of the connection terminals.

The wiring board according to the second preferred embodiment of the invention is a wiring board (an interposer) for use in a semiconductor device (package) such as BGA or CSP, for matching between the external terminal of the semiconductor chip and the connection terminal (wiring) in the mounting substrate, or for grid conversion. Therefore, a ball terminal formed of an Sn—Pb-base solder or the like is provided in the portion provided with the terminal plating 6 in each connection terminal in the fourth conductor layer M4 as shown in FIG. 19.

As with the wiring board according to the first preferred embodiment of the invention, in the wiring board according to the second preferred embodiment of the invention, the ground terminal 204A, the first power supply terminal 204D, and the second power supply terminal 204E are provided on the inside of the signal terminal 204C to reduce the wiring length and thus to prevent a deterioration in characteristics caused by voltage drop or the like.

FIGS. 20 to 22 are typical cross-sectional views illustrating a production process of the wiring board according to the second preferred embodiment of the invention, wherein FIGS. 20A, 20B, 21A, 21B, 22A, and 22B are cross-sectional views in each step in the production process as viewed in the same cross section as that in FIG. 19.

The production process of the wiring board according to the second preferred embodiment of the invention will be explained in conjunction with FIGS. 20 to 22. The detailed explanation of the same steps as in the production process of the wiring board according to the above preferred embodiment will be omitted.

At the outset, according to the procedure explained above in connection with the first preferred embodiment, as shown in FIG. 20A, a first conductor film 201' is formed on the surface of the first insulating substrate 101. The ground pattern 202A is formed on the first insulting substrate 101 in its surface remote from the first conductor film 201' to prepare a laminate. A fourth conductor film 203' is formed on the ground pattern 202A through the second insulator 102.

Next, a second via hole VH2, which extends from the fourth conductor film 203' side through the second insulator 102, the embedded insulator 4, and the first insulator 101 to the first conductor film 201', is formed, and, as shown in FIG. 20B, thereafter, the fifth conductor film (electrolytic copper plating) 303 is formed on the surface of the fourth conductor film 203' and on the inner wall of the second via hole VH2.

Next, the fourth conductor film 203' and the electrolytic copper plating 303 provided on the surface of the fourth conductor film 203' are etched to form the first power supply pattern 203D. Thereafter, as shown in FIG. 21A, the insulator 4 is embedded in the opening in the first power supply pattern 203D and in the via 303D to flatten the surface. In this case, the first power supply pattern 202D is formed by etching in such a manner that only the circumference of the region for the formation of the via 304A for connecting the ground terminal 204A to the ground pattern 202A, the via 304E for connecting the second power supply terminal 204E to the second power supply terminal 201E, and the via 304C for connecting the signal terminal 204C to the signal wiring 201C is opened.

Next, as shown in FIG. 21B, the sixth conductor film 204' is formed on the surface of the first power supply pattern 203D through the third insulator 103.

Next, the third via hole VH3, which extends through the third insulating substrate 103, the embedded insulator 4, and the second insulator 102 to the ground pattern 202A, the fourth via hole VH4, which extends through the third insulating substrate 103 to the first power supply pattern 203D, and the fifth via hole VH5, which extends through the third insulating substrate 103, the embedded insulator 4, the second insulating substrate 102, the embedded insulator 4, and the first insulating substrate 101 to the first conductor film 201' are formed from the sixth conductor film 204' side. Thereafter, as shown in FIG. 22A, the seventh conductor film (electrolytic copper plating) 304 is formed on the surface of the sixth conductor film 204' and on the inner wall of the third via hole VH3, the fourth via hole VH4, and the fifth via hole VH5.

The third via hole VH3, the fourth via hole VH4, and the fifth via hole VH5 are preferably formed by the same method as used in the formation of the second via hole VH2 and the third via hole VH3 in the production process of the wiring board according to the first preferred embodiment of the invention, that is, by forming openings by a carbonic gas laser beam using the sixth conductor film 204' having openings at its predetermined positions as a mask. The etching by the carbonic gas laser selectively etches the insulator and does not etch the metal film and the like. Therefore, the first insulator 101, the second insulator 102, the third insulator 103, and the embedded insulator 4 can be selectively etched. Specifically, when etching is carried out based on the depth of the fifth via hole VH5 having the largest depth, the fourth via hole VH4 first reaches the first power supply pattern 203D (fifth conductor film 303) and the progress of etching is stopped. Next, the third via hole VH3 reaches the ground pattern 202A (third conductor film 302) and the progress of etching is stopped. Finally, as soon as the fifth via hole VH5 has reached the first conductor film 201', the whole etching treatment is completed. Therefore, the third via hole VH3, the fourth via hole VH4, and the fifth via hole VH5 different from one another in depth can be simultaneously formed.

Next, as shown in FIG. 22B, the first conductor film 201' is etched to form the ground wiring 201A, the first power supply wiring 201D, the second power supply wiring 201E, and the signal wiring 201C, and the sixth conductor film 204' and the seventh conductor film 304 provided on the surface of the sixth conductor film 204' are etched to form the ground terminal 204A, the first power supply terminal 204D, the second power supply terminal 204E, and the signal terminal 204C.

Thereafter, as shown in FIG. 19, a solder protective film 5 is formed in such a manner that a predetermined region on each conductor wiring of the first conductor layer M1 and a predetermined region of each connection terminal of the fourth conductor layer M4 are opened. For example, a terminal plating 6 such as a gold plating is formed on the exposed surface of each conductor wiring and each connection terminal. Thus, the wiring board according to the second preferred embodiment of the invention is prepared.

As with the wiring board according to the first preferred embodiment of the invention, in the wiring board according the second preferred embodiment of the invention, as shown in FIG. 15, the conductor wirings in the first conductor layer M1, particularly the signal wiring 201C, can be formed in all the sections so as to pass over the ground pattern provided in the second conductor layer M2, and, thus, the effect of a microstrip composed of the signal wiring 201C, the first insulating substrate 101, and the ground pattern 202A can be satisfactorily attained.

As described above, according to the wiring board according to the second preferred embodiment of the invention, four conductor layers of the first conductor layer M1, the second conductor layer M2, the third conductor layer M3, and the fourth conductor layer M4 are provided, conductor wirings connected to the external terminal of a semiconductor chip are provided in the first conductor layer M1, a conductor pattern (a ground pattern) 202A connected to a conductor wiring (a ground wiring) 201A, for providing a power supply of ground potential, among the conductor wirings in the first conductor layer is provided in the second conductor layer M2, and a connection terminal connected to the terminal (wiring) of the mounting substrate is provided in the fourth conductor layer. According to this construction, the area of the ground pattern 202A provided in the second conductor layer M2 can be increased. This permits the conductor wiring (signal wiring) 201C for transmitting electric signals in the first conductor layer M1 to pass over the ground pattern 202A in all the sections. Consequently, the effect of the microstrip comprising the signal wiring 201C, the first insulator 101, and the ground pattern 202A can be satisfactorily attained to facilitate the control of the characteristic impedance. Further, since the control of the characteristic impedance becomes easy, noise is less likely to occur in electric signals which flow through the signal wiring 201C, contributing to the prevention of a deterioration in high frequency characteristics.

Further, when the first power supply pattern 203D is provided in the third conductor layer M3 and the second power supply terminal 204E, which is spread over the whole region except for the circumference of other terminals, is provided in the fourth conductor layer M4, even in the case of the provision of two operation power supplies different from each other in potential, interference of potential between the power supplies and a deterioration in electrical characteristics caused by high frequency signals can be reduced.

Further, the via 303D for connecting the first power supply wiring 201D provided in the first conductor layer M1 to the first power supply pattern 203D provided in the third conductor layer M3 is provided on the inner wall of the second via hole VH2, which extends through the first insulating substrate 101, the embedded insulator 4, and the second insulator 102 to directly connect the first power supply wiring 201D to the first power supply pattern 203D, and the via 304E for connecting the second power supply wiring 201E provided in the first conductor layer M1 to the second power supply terminal 204E provided in the fourth conductor layer M4 and the via 304C for connecting the signal wiring 201C provided in the first conductor layer M1 to the signal terminal 204C provided in the fourth conductor layer M4 are provided on the inner wall of the via hole VH5 which extends through the first insulator 101, the embedded insulator 4, and the second insulator 102 to directly connect the second power supply wiring 201E to the second power supply terminal 204E and to directly connect the signal wiring 201C to the signal terminal 204C. According to this construction, as compared with, for example, stack via connection, the number of steps required for the production process can be reduced, and, the problem of a lowering in connection reliability caused, for example, by misregistration in stacking of vias in two or more stages can be solved. Therefore, a wiring board having high connection reliability can be produced.

Further, when the via 303D for connecting the first power supply wiring 201D provided in the first conductor layer M1 to the first power supply pattern 203D provided in the third conductor layer M3 is provided on the inner wall of the second via hole VH2, which extends through the first insulating substrate 101, the embedded insulator 4, and the second insulator 102 to directly connect the first power supply wiring 201D to the first power supply pattern 203D, and the via 304E for connecting the second power supply wiring 201E provided in the first conductor layer M1 to the second power supply terminal 204E provided in the fourth conductor layer M4 and the via 304C for connecting the signal wiring 201C provided in the first conductor layer M1 to the signal terminal 204C provided in the fourth conductor layer M4 are provided on the inner wall of the via hole VH5 which extends through the first insulator 101, the embedded insulator 4, and the second insulator 102 to directly connect the second power supply wiring 201E to the second power supply terminal 204E and to directly connect the signal wiring 201C to the signal terminal 204C, the area of the opening formed in the ground pattern 202A can be reduced and the possibility of the passage of the signal wiring 201C over the opening in the ground pattern 202A can be further reduced to prevent a deterioration in high frequency characteristics of electric signals.

In this case, when the area of the opening in the ground pattern 202A is reduced, as with the wiring substrate according to the first preferred embodiment of the invention, the spacing between the vias can be narrowed. By virtue of this, a reduction in size of the wiring board and higher density conductor wiring can be easily attained.

The effects attained by representative features of the invention will be summarized below.

(1) In a wiring board having a microstrip structure, the characteristic impedance can be easily controlled.

(2) In a wiring board having a microstrip structure, a deterioration in high frequency characteristics of electric signals can be prevented.

(3) In a wiring board having a microstrip structure, higher density conductor wiring can be easily realized.

The invention has been described in detail with particular reference to preferred embodiments, but it will be understood that variations and modifications can be effected within the scope of the invention as set forth in the appended claims.

What is claimed is:

1. A wiring board comprising: a first insulating layer; a first conductor layer provided on the surface of the first insulating layer; a second conductor layer provided on the first insulating layer in its surface remote from the first conductor layer; and a third conductor layer provided through a second insulating layer on the second conductor layer provided on the first insulating layer, wherein conductor wirings to be connected to a semiconductor chip in its external terminal (bonding pad) are provided in the first conductor layer, only a conductor pattern connected through a via to a ground wiring, for supplying a power supply of ground potential to the semiconductor chip, among the conductor wirings provided in the first conductor layer is provided in the second conductor layer, a power supply terminal connected through a via to a power supply wiring, for supplying an operation power supply of a potential other than the ground potential to the semiconductor chip, among the conductor wirings provided in the first conductor layer, a signal terminal connected through a via to a signal wiring for transmitting an electric signal, and a ground terminal connected through a via to the conductor pattern in the second conductor layer are provided in the third conductor layer, and the conductor pattern provided in the second conductor layer is spread over the whole region except for the circumference of the via for connecting the power supply wiring to the power supply terminal and the via for connecting the signal wiring to the signal terminal.

2. The wiring board according to claim 1, wherein the power supply terminal is spread over the whole region except for the circumference of the ground terminal and the signal terminal.

3. The wiring board according to claim 1, wherein direct connection of the power supply wiring to the power supply terminal and direct connection of the signal wiring to the signal terminal each are provided through a via which passes through the first insulating layer and the second insulating layer.

4. A wiring board comprising: a first insulating layer; a first conductor layer provided on the surface of the first insulating layer; a second conductor layer provided on the first insulating layer in its surface remote from the first conductor layer; a third conductor layer provided through a second insulating layer on the surface of the second conductor layer provided on the first insulating layer; and a fourth conductor layer provided through a third insulating layer on the surface of the third conductor layer, wherein conductor wirings to be connected to a semiconductor chip in its external terminal (bonding pad) are provided in the first conductor layer, only a conductor pattern connected through a via to a ground wiring, for supplying a power supply of ground potential to the semiconductor chip, among the conductor wirings provided in the first conductor layer is provided in the second conductor layer, a conductor pattern connected through a via to a first power supply wiring, for supplying an operation power supply of a first potential different from the ground potential to the semiconductor chip, among the conductor wirings provided in the first conductor layer is provided in the third conductor layer, a second power supply terminal connected through a via to a second power supply wiring, for supplying an operation power supply of a second potential different from the ground potential and the first potential to the semiconductor chip, among the conductor wirings provided in the first conductor layer, a signal terminal connected through a via to a signal wiring for transmitting an electric signal, a ground terminal connected through a via to the conductor pattern in the second conductor layer, and a first power supply terminal connected through a via to the conductor pattern in the third conductor layer are provided in the fourth conductor layer, and the conductor pattern provided in the second conductor layer is spread over the whole region except for the circumference of the via for connecting the second power supply wiring to the second power supply terminal, the via for connecting the first power supply terminal to the conductor pattern in the third conductor layer, and the via for connecting the signal wiring to the signal terminal.

5. The wiring board according to claim 4, wherein the conductor pattern provided in the third conductor layer is spread over the whole region except for the circumference of the via for connecting the second power supply wiring to the second power supply terminal, the via for connecting the conductor pattern in the second conductor layer to the ground terminal, and the via for connecting the signal wiring to the signal terminal.

6. The wiring board according to claim 4, wherein the second power supply terminal is spread over the whole region except for the circumference of the ground terminal, the first power supply terminal, and the signal terminal.

7. The wiring board according to claim 4, wherein direct connection of the second power supply wiring to the second power supply terminal and direct connection of the signal wiring to the signal terminal each are provided through a via, which passes through the first insulating layer, the second insulating layer, and the third insulating layer, and the first power supply terminal is connected directly to the conductor pattern provided in the third conductor layer through a via which passes through the first conductor layer and the second insulating layer.

8. The wiring board according to claims 4, wherein the conductor pattern in the second conductor layer is connected directly to the ground terminal through a via which passes through the second insulating layer and the third insulating layer.

* * * * *

UNITED STATES PATENT AND TRADEMARK OFFICE
CERTIFICATE OF CORRECTION

PATENT NO. : 6,924,987 B2
DATED : August 2, 2005
INVENTOR(S) : Hiroshi Sugimoto, Tatsuya Ohtaka and Shigeharu Takahagi It is certified that error appears in the above-identified patent and that said Letters Patent is hereby corrected as shown below:

Column 9,
Line 45, insert -- - -- between "cross" and "sectional".
Line 46, delete "respective".
Line 47, delete "15" and insert -- 5 --.

Signed and Sealed this

First Day of November, 2005

JON W. DUDAS
*Director of the United States Patent and Trademark Office*